(12) United States Patent
Babakhani et al.

(10) Patent No.: US 10,168,478 B2
(45) Date of Patent: *Jan. 1, 2019

(54) INTEGRATION OF PHOTONIC, ELECTRONIC, AND SENSOR DEVICES WITH SOI VLSI MICROPROCESSOR TECHNOLOGY

(71) Applicant: INTERNATIONAL BUSINESS MACHINES CORPORATION, Armonk, NY (US)

(72) Inventors: Aydin Babakhani, Houston, TX (US); Steven A. Cordes, Yorktown Heights, NY (US); Jean-Olivier Plouchart, New York, NY (US); Scott K. Reynolds, Amawalk, NY (US); Peter J. Sorce, Poughkeepsie, NY (US); Robert E. Trzcinski, Rhinebeck, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 37 days.

This patent is subject to a terminal disclaimer.

(21) Appl. No.: 15/466,966

(22) Filed: Mar. 23, 2017

(65) Prior Publication Data

US 2017/0192172 A1    Jul. 6, 2017

Related U.S. Application Data

(63) Continuation of application No. 14/243,436, filed on Apr. 2, 2014, now Pat. No. 9,632,251.

(51) Int. Cl.
*G02B 6/13* (2006.01)
*H01L 31/0232* (2014.01)
(Continued)

(52) U.S. Cl.
CPC .............. *G02B 6/13* (2013.01); *G02B 6/124* (2013.01); *G02B 6/12004* (2013.01); *G02B 6/30* (2013.01);
(Continued)

(58) Field of Classification Search
CPC ............ H01S 5/022; H01S 5/02; H01L 31/18
See application file for complete search history.

(56) References Cited

U.S. PATENT DOCUMENTS 5,534,094 A    7/1996   Arjavalingam et al.
6,083,766 A    7/2000   Chen
(Continued)

FOREIGN PATENT DOCUMENTS

EP    1482539 A1    12/2004
EP    1992949 A1    11/2008
(Continued)

OTHER PUBLICATIONS

Fard, S. et al. "Optical Absorption Glucose Measurements Using 2.3-μM Vertical-Cavity Semiconductor Lasers" IEEE Photonics Technology Letters, vol. 20, No. 11. Jun. 1, 2008. pp. 930-932.
(Continued)

*Primary Examiner* — Mohammad Choudhry
(74) *Attorney, Agent, or Firm* — Tutunjian & Bitetto, P.C.; Vazken Alexanian

(57) ABSTRACT

According to an aspect of the present principles, methods are provided for fabricating an integrated structure. A method includes forming a very large scale integration (VLSI) structure including a semiconductor layer at a top of the VLSI structure. The method further includes mounting the VLSI structure to a support structure. The method additionally includes removing at least a portion of the semiconductor layer from the VLSI structure. The method also includes attaching an upper layer to the top of the VLSI structure. The
(Continued)

upper layer is primarily composed of a material that has at least one of a higher resistivity or a higher transparency than the semiconductor layer. The upper layer includes at least one hole for at least one of a photonic device or an electronic device. The method further includes releasing said VLSI structure from the support structure.

20 Claims, 20 Drawing Sheets

(51) Int. Cl.
|  |  |  |
|---|---|---|
| H01L 31/18 | (2006.01) |
| H01L 27/144 | (2006.01) |
| H01S 5/022 | (2006.01) |
| H01S 5/02 | (2006.01) |
| H01S 5/183 | (2006.01) |
| G02B 6/42 | (2006.01) |
| H01S 5/10 | (2006.01) |
| G02B 6/12 | (2006.01) |
| G02B 6/124 | (2006.01) |
| G02B 6/30 | (2006.01) |

(52) U.S. Cl.
CPC .......... *G02B 6/42* (2013.01); *H01L 27/1446* (2013.01); *H01L 31/02327* (2013.01); *H01L 31/18* (2013.01); *H01S 5/021* (2013.01); *H01S 5/02248* (2013.01); *H01S 5/1071* (2013.01); *H01S 5/183* (2013.01); *G02B 2006/12121* (2013.01); *H01L 2224/16225* (2013.01)

(56) References Cited

U.S. PATENT DOCUMENTS

| | | |
|---|---|---|
| 6,093,941 A | 7/2000 | Russell et al. |
| 6,399,997 B1 | 6/2002 | Lin et al. |
| 6,418,029 B1 | 7/2002 | McKee et al. |
| 6,617,681 B1 | 9/2003 | Bohr |
| 6,858,892 B2 | 2/2005 | Yamagata |
| 7,157,741 B2 | 1/2007 | Kim et al. |
| 7,220,667 B2 | 5/2007 | Yamagata |
| 8,093,628 B2 | 1/2012 | Yang et al. |
| 8,129,811 B2 | 3/2012 | Assefa et al. |
| 9,632,251 B2 * | 4/2017 | Babakhani .......... H01L 27/1446 |
| 2009/0230542 A1 | 9/2009 | Lin et al. |
| 2010/0151614 A1 | 6/2010 | Darbinyan et al. |
| 2012/0055236 A1 | 3/2012 | Takulapalli |
| 2012/0228730 A1 | 9/2012 | Akiyama et al. |
| 2012/0269481 A1 | 10/2012 | Erickson et al. |

FOREIGN PATENT DOCUMENTS

| | | |
|---|---|---|
| EP | 1929276 B1 | 7/2011 |
| EP | 2375242 A1 | 10/2011 |
| EP | 2255177 B1 | 6/2012 |
| JP | 2002246309 | 8/2002 |
| WO | WO2011133670 A3 | 10/2011 |

OTHER PUBLICATIONS

Jokerst, N. et al. "Chip Scale Integrated Planar Photonics" Optoelectronic Integrated Circuits X. vol. 6897. Feb. 2008. (12 Pages).

Kim, J. et al. "High-Performance Three-Dimensional On-Chip Inductors in SO1 CMOS Technology for Monolithic RF Circuit Applications" IEEE Radio Frequency Integrated Circuits Symposium. Jun. 2003. pp. 591-594.

Larsen, K. et al. "SO1 Silicon on Glass for Optical MEMS" The 1Zth International Conference on Solid Slate Sensors, Actuators and Microsystems. Jun. 2003. pp. 1655-1658.

Trabelsi, A. et al. "Blood Glucose Optical Bio-Implant: Preliminary Design Guidelines" Biomedical Circuits and Systems Conference. Nov. 2010. pp. 150-153.

Wagemans, A., et al. "FP 16.3: A 3.5MW 2.5GHZ Diversity Receiver and a 1.2MW 3.6GHZ VCO in Silicon-on-Anything" 1998 IEEE International Solid-State Circuits Conference. Feb. 1998. pp. 250-252.

List of IBM Patents or Patent Applications Treated as Related dated Mar. 23, 2017, 2 pages.

* cited by examiner

INTEGRATION OF PHOTONIC, ELECTRONIC, AND SENSOR DEVICES WITH SOI VLSI MICROPROCESSOR TECHNOLOGY

BACKGROUND

Technical Field

The present invention relates to very large scale integration (VLSI) circuits, and more particularly to the integration of photonic, electronic and sensor devices with semiconductor on insulator (SOI) VLSI circuits.

Description of the Related Art

VLSI technology has been employed for the last few decades to fabricate integrated circuits by combining thousands of electrical components on a single chip. The technology has long formed the basis of microprocessor fabrication, and VLSI manufacturing processes are relatively cost-effective to implement due to their widespread use and the availability of raw materials utilized in VLSI processes. Advanced SOI VLSI technologies typically employ a buried oxide layer (BOX) that is about 150 nm thick, which is sufficient for a large variety of electronic devices.

SUMMARY

According to an aspect of the present principles, there is provided a method for fabricating an integrated structure. The method includes forming a very large scale integration (VLSI) structure including a semiconductor layer at a top of the VLSI structure. The method further includes mounting the VLSI structure to a support structure. The method additionally includes removing at least a portion of the semiconductor layer from the VLSI structure. The method also includes attaching an upper layer to the top of the VLSI structure. The upper layer is primarily composed of a material that has at least one of a higher resistivity or a higher transparency than the semiconductor layer. The upper layer includes at least one hole for at least one of a photonic device or an electronic device. The method further includes releasing said VLSI structure from the support structure.

According to another aspect of the present principles, there is provided a method for fabricating an integrated structure. The method includes forming a very large scale integration (VLSI) structure including a semiconductor layer at a top of the VLSI structure, a dielectric layer with a thickness of less than 200 nm beneath the semiconductor layer. At least a portion of a photonic device is beneath the dielectric layer and at least a portion of an electronic device is beneath the dielectric layer. The method further includes mounting the VLSI structure to a support structure that is at least partially transparent. The method additionally includes removing at least a portion of the semiconductor layer from the VLSI structure. The method also includes attaching an upper layer to the top of the VLSI structure. The upper layer has at least one of a higher resistivity or a higher transparency than the semiconductor layer. The upper layer includes at least one hole for at least one of the photonic device or the electronic device. The method further includes releasing said VLSI structure from the support structure.

According to yet another aspect of the present principles, there is provided a very large scale integration (VLSI) integrated structure. The VLSI integrated structure includes a first device layer including a first portion of a photonic device configured to transmit optical waves coded with data and including a first portion of an electronic device. The VLSI structure further includes a dielectric layer have a thickness of less than 200 nm disposed above the first device layer. The VLSI structure additionally includes a second device layer disposed above the dielectric layer. The device layer includes a second portion of at least one of the photonic device or the electronic device. The second device layer is primarily composed of a material that has a resistivity of at least 10 Ohm.com and a transparency of at least eighty percent to reduce optical leakage in the second device layer.

According to still another aspect of the present principles, there is provided a method for fabricating an optical sensor. The method includes forming a very large scale integration (VLSI) structure including a semiconductor layer at a top of the VLSI structure. The method further includes mounting the VLSI structure to a support structure. The method additionally includes removing at least a portion of the semiconductor layer from the VLSI structure. The method also includes attaching an upper layer to the top of the VLSI structure. The upper layer is primarily composed of a material that has at least one of a higher resistivity or a higher transparency than the semiconductor layer. The upper layer includes at least one microfluidic channel. The method further includes releasing said VLSI structure from the support structure.

According to a further aspect of the present principles, there is provided a method for fabricating an optical sensor. The method includes forming a very large scale integration (VLSI) structure including a semiconductor layer at a top of the VLSI structure, and a dielectric layer with a thickness of less than 200 nm beneath the semiconductor layer. The method further includes mounting the VLSI structure to a support structure that is at least partially transparent. The method additionally includes removing at least a portion of the semiconductor layer from the VLSI structure. The method also includes attaching an upper layer to the top of the VLSI structure. The upper layer has at least one of a higher resistivity or a higher transparency than the semiconductor layer. The upper layer includes at least one microfluidic channel. The method further includes releasing said VLSI structure from the support structure.

According to a still further aspect of the present principles, there is provided a very large scale integration (VLSI) integrated structure. The VLSI structure includes a VLSI device layer including at least one photonic device and at least one electronic device. The VLSI structure further includes a dielectric layer have a thickness of less than 200 nm disposed above the VLSI device layer. The VLSI structure additionally includes an upper layer disposed above the dielectric layer. The upper layer includes at least one microfluidic channel. The upper layer is primarily composed of a material that has a resistivity of at least 10 Ohm.com and a transparency of at least eighty percent to reduce optical leakage in the upper layer.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
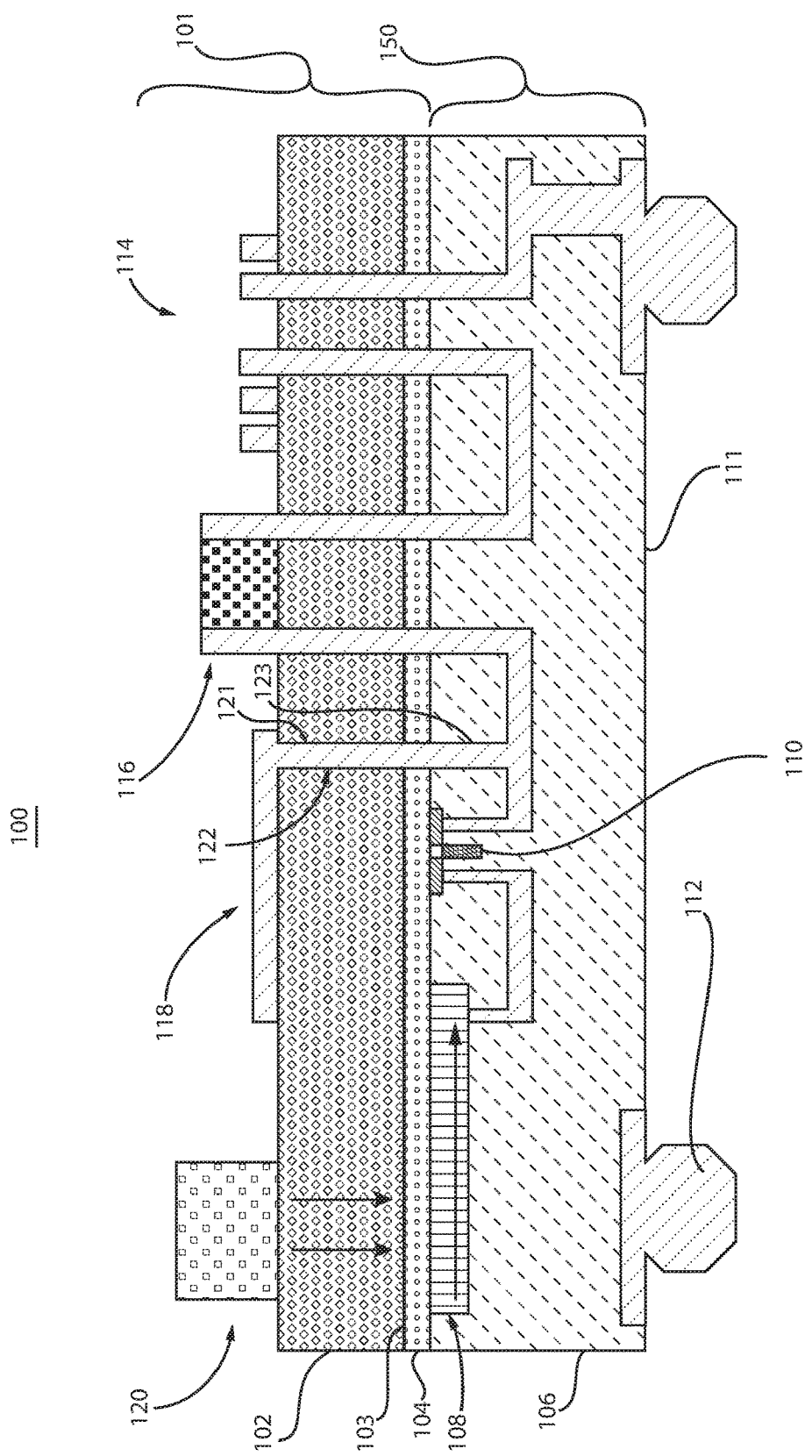
FIG. 1 is a cross-sectional view of an exemplary VLSI chip including photonic and electronic devices, in accordance with an embodiment of the present principles.

VLSI technology is relatively simple and cost-effective to implement due to its widespread use and the availability of raw materials utilized in VLSI processes. Thus, it is highly desirable to employ VLSI technology to fabricate electronic devices. However, because SOI VLSI technologies utilize BOX layers that are less than 200 nm thick, they are generally unsuitable for the fabrication of photonics devices. In particular, due to its lack of thickness, the relatively thin BOX layer cannot confine light into the silicon layer above the BOX layer and, as a result, permits light to leak into the silicon substrate. As such, for photonics devices formed in silicon on insulator substrates, the thickness of the BOX layer is greater than 1 µm for light within the wavelength range of between 1.3 µm and 1.5 µm.

For example, optical refractive index sensors in particular use high-Q optical resonators and micro-fluidic channels that have been employed in specialized SOI photonics technologies. Photonics functions like high-Q resonators and grated-couplers have also been employed in standard radio frequency (RF) SOI foundry technology. However, the micro-fluidic channel is not integrated with the RF SOI circuitry. Both technologies use a thick buried oxide layer (BOX) typically larger than 1 µm for a typical light wavelength between 1.3 and 1.5 µm to confine the light into the silicon layer. In addition, as noted above, advanced SOI VLSI technologies use a BOX thickness that is less than 200 nm, typically a thickness of 150 nm, which poses a problem for optical signal losses due to its relatively low thickness.

Another integration challenge for VLSI technologies is the integration of high-performance passive devices. For example, passive devices typically occupy a relative large space on the chip and are difficult to accommodate with standard VLSI technology. In addition, passive devices formed with standard VLSI technologies are prone to radio frequency (RF) signal losses in the silicon substrate.

Embodiments of the present application enable the integration of photonic and electronic devices with chips formed in accordance with VLSI processes in a way that avoids optical and RF signal losses in a semiconductor substrate. In particular, preferred embodiments provide methods and structures for integrating low-loss optical and high Q RF/(sub)-mm wave passive devices in VLSI SOI microprocessor technologies. For example, as discussed further herein below, an SOI chip including a portion of photonic and/or electronic devices can be formed using VLSI manufacturing processes. In addition, a separate upper layer including structures that accommodate photonic and/or electronic devices can be prefabricated and transferred onto the VLSI chip, in place of the semiconductor substrate. Here, the structures can include holes for subsequent insertion of portions of photonic and/or electronic devices or can include the portions of the photonic and/or electronic devices themselves. Preferably, the structures are prefabricated in the upper layer prior to transfer onto the VLSI chip to ensure that the structural integrity of the photonic or electronic components in the VLSI chip is maintained. Further, the upper layer can be composed of a material that has a high transparency and a highly resistivity, such as glass, quartz and other materials. Thus, by employing an upper device layer in this way, simple and cost-effective VLSI technology can be used to fabricate chips including photonic and electronic devices while at the same time avoiding optical and RF signal losses in the substrate.

As will be appreciated by one skilled in the art, aspects of the present invention may be embodied as a system, method, device or apparatus. Thus, the flowchart and block diagrams in the Figures illustrate the architecture, functionality, and operation of possible implementations of systems, methods, devices or apparatuses according to various embodiments of the present invention. It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved.

It is to be understood that the present invention will be described in terms of a given illustrative architecture having a substrate; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. Similarly, it will also be understood that when an element described as a layer, region or substrate is referred to as being "beneath" or "under" another element, it can be directly beneath the other element or intervening elements may also be present. In contrast, when an element is referred to as being "directly beneath" or "directly under" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

As indicated above, embodiments of the present invention enable an effective integration of optical and RF components with SOI VLSI circuits. In addition, the embodiments also enable packaging of a small communication system including such components in a small package. For example, the embodiments can integrate electrical and photonic processing devices with RF/(sub)-mm Wave passive devices, such as, for example, capacitors, inductors, antennas, to form a communication system in a small package.

Figure 8:
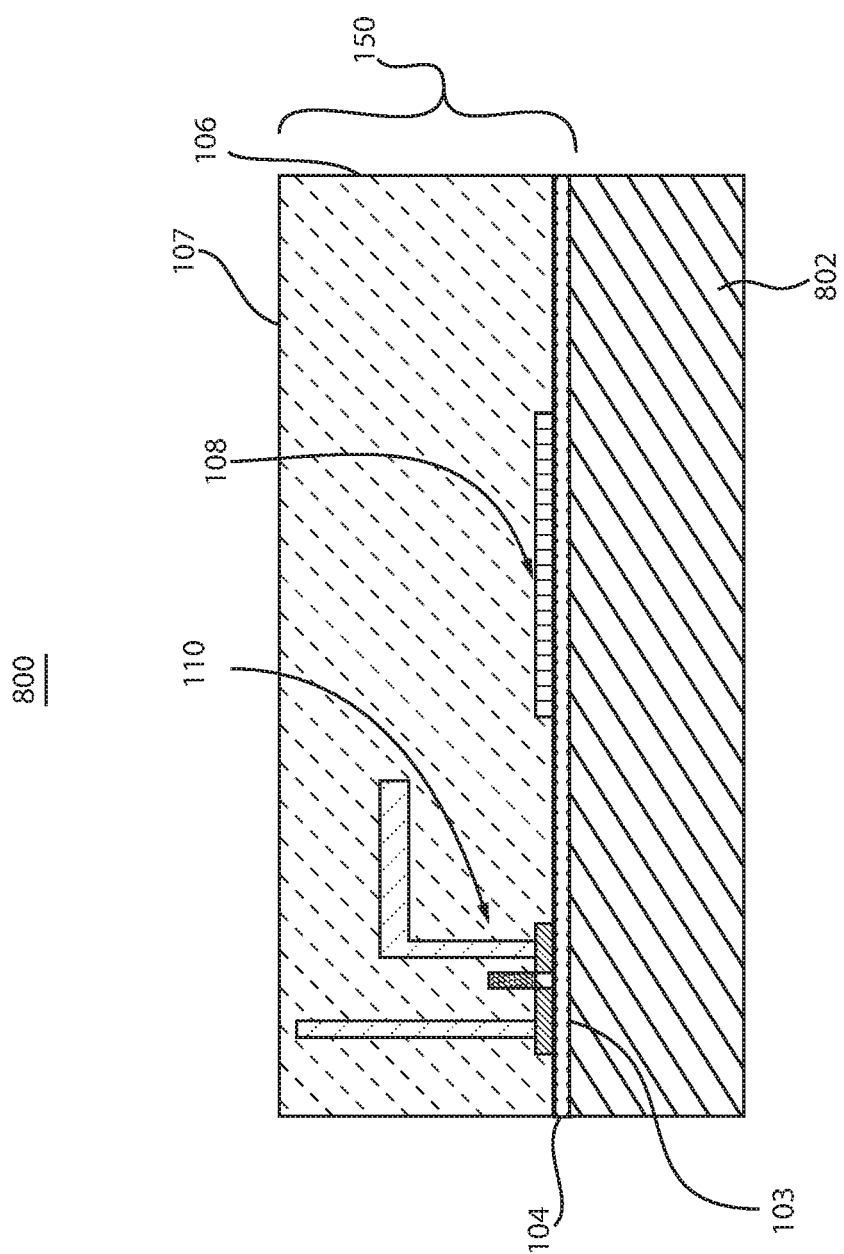
FIG. 8 is a cross-sectional view of an exemplary VLSI structure having an SOI VLSI circuit integrated with photonic devices that can be formed in accordance with VLSI processing techniques, in accordance with an embodiment of the present principles.

Referring now to the drawings in which like numerals represent the same or similar elements and initially to FIG. 8, an exemplary VLSI structure 800 is illustratively depicted. The particular VLSI structure 800 illustrated in FIG. 8 is an SOI VLSI circuit integrated with photonic devices that can be formed in accordance with VLSI processing techniques. Here, the structure 800 includes a semiconductor substrate 802, which can be, for example, a Si, SiGe or Ge substrate, and a device layer 150 that includes an active circuit and a photonic sensor. For example, the device layer 150 includes an active antenna device 110 and a photonic waveguide 108 that are formed on top of a dielectric layer 104 and are covered with a dielectric material 106, which can have a dielectric constant $\varepsilon=2$-3.9. In one exemplary VLSI structure, the dielectric material has a dielectric constant $\varepsilon$ of between 2 and 3.9, while the dielectric layer 104 is a BOX layer composed of $SiO_2$ having a dielectric constant of 3.9. In addition, the photonic waveguide, as well as all photonic waveguides disclosed herein, can be, for example, composed of silicon with a dielectric constant of $\varepsilon=11$. The antenna device 110 can be formed of a conductor, such as copper or another suitable metal or material. It should be noted that the structure 800 can be a single chip cut from a wafer or can be part of a wafer itself, where the illustration provided in FIG. 8 is only a portion of a wafer. Thus, the structure 800 illustrated in FIG. 8 can be repeated in the wafer to form a pattern of structures 800.

The structure 800 can be formed using VLSI processes. As a result, the structure 800 is relatively easy to fabricate in a cost-effective manner. However, as noted above, a problem with VLSI SOI structures is that light is leaked into the substrate, as the BOX layer is very thin; it is on the order of $\lambda/10$, where $\lambda$ is the carrier wavelength of light transmitted through the photonic device. To alter the BOX thickness, important changes in the manufacturing process would have to be made. Ultimately, it may require the development, qualification and implementation of a new manufacturing process, which is very expensive.

Thus, to address the problem, exemplary embodiments of the present invention employ a transfer process, where the semiconductor substrate is replaced with an upper device layer that has a high transparency and a high resistivity and is prefabricated with structures, which accommodate both photonic and electronic devices. Due to the transparent and resistive nature of the material, both optical and RF signal loss is minimized.

FIG. 1 illustrates an exemplary VLSI integrated structure 100 that can be formed in accordance with embodiments of the present invention. In one example, the VLSI structure 100 can include Si electronics, a photonic device and a laser source 120 integrated on a transparent substrate 102 and packaged to a wafer using C4 connectors 112. For example, the device 100 can include a vertical-cavity surface-emitting laser (VCSEL) as the laser source 120 that is integrated into an upper device layer 101 that is primarily composed of a material 102 that has a transparency of at least 80% and a resistivity of at least 10 Ohm·cm. For example, the upper device layer 101 can be primarily composed of glass, quartz, sapphire, etc. Further, the upper device layer can include an antenna 118, formed of a conductive material, such as copper, capacitor 116, which can be an SMT (surface mount technology) or MIM (metal-insulator-metal) capacitor, and an inductor 114, which can be an SMT or spiral inductor. Each of the elements can be attached to, or formed on top of, the transparent and resistive material composing the upper device layer 101. In addition, the device layer 101 can include prefabricated holes 121 including vias 122, which can be, for example, through-glass vias, and can be composed of a conductor, such as copper or other suitable metal or other material. The vias 122 can be formed in the holes 121 to electrically couple the electronic devices 114, 116 and 118 to the lower device layer 150, as illustrated in FIG. 1. As noted above, the dielectric layer is less than 200 nm, preferably about 150 nm, as it was formed in accordance with VLSI technology. The laser source 120 and the photonic waveguide 108 constitute an exemplary photonic device, where the laser source 120 is optically coupled to the waveguide 108, as light from the laser source is transmitted through the photonic waveguide 108 for further processing for purposes of, for example, inter- or intra-chip communication. For example, the photonic device can modulate/encode the light transmitted through the waveguide 108 with data for communication with other components of the VLSI structure or with another VLSI structure. In addition, the antenna 118 and the active device 110 form an electronic device, such as an RF receiver, RF transmitter or an RF transceiver. The bottom of the structure 100 can be coupled to a wafer or circuit board with conductive connectors 112, which can be, for example, C4 ball connectors, and which can be employed to transmit power and/or signals to or from the VLSI structure 100.

One advantage of methods described herein is that the upper device layer 101 can be attached to the "back side" 103 of the VLSI device layer 150. Here, the side 103 is the "back side," as the devices of the VLSI device layer, such as elements 108 and 110, are formed on top of the dielectric layer 104 when the VLSI structure 150 is inverted with respect to the orientation illustrated in FIG. 1. Since the upper device layer 101 is attached to the back side 103 of the VLSI structure 150, the opposing side 111 can be employed to "flip-chip" the structure 100 and attach the opposing side 111 of the structure 100 onto a wafer using, for example, connectors 112. The capability of forming the upper device layer 101 on the back side 103 of the VLSI structure 150 and attaching the opposing side 111 of the structure 100 to a wafer is one of the reasons why the method is compatible with VLSI technology. For example, mounting the backside of a VLSI structure onto a wafer is unsuitable, as the first level of metal cannot be used as a bond pad because it is too thin for bonding or flip-chip packaging.

Figure 2:
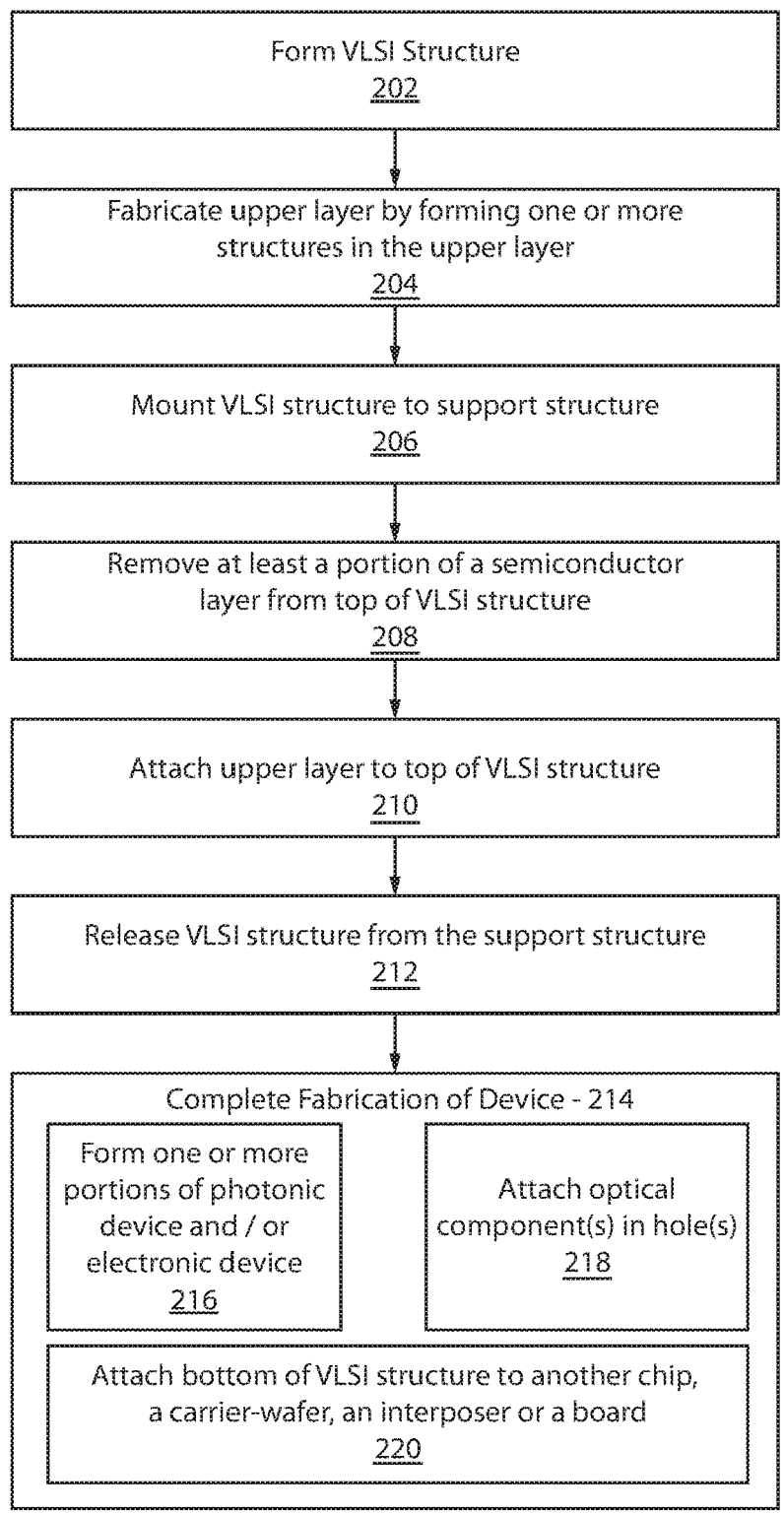
FIG. 2 is a flowchart of an exemplary method for fabricating an integrated VLSI structure, in accordance with one or more embodiments of the present principles.

Referring now to FIG. 2, with continuing reference to FIGS. 1 and 8, an exemplary method for fabricating an integrated VLSI structure in accordance with exemplary embodiments of the present invention is illustratively depicted. Here, the method 200 can be used to form the VLSI structure 100 illustrated in FIG. 1. Preliminarily, at step 202, a preliminary VLSI structure can be formed. For example, an SOI VLSI chip, such as the structure 800 illustrated in FIG. 8, can be fabricated using VLSI methods. As noted above, the structure 800 can be an individual chip or part of a wafer and can include photonic and/or electronic elements.

At step 204, an upper device layer can be fabricated by forming one or more structures in the upper layer. For example, a high-resistivity transparent substrate can be prepared with holes 121 through the substrate. Here, the holes can be via-holes for formation of vias in the substrate 102 and can be etched or drilled into the substrate 102. The substrate can, for example, be the high-resistivity transparent substrate 102 discussed above. The term "transparent" should be understood to mean that the substrate or material at issue has a low absorption for electromagnetic wavelengths typically between 300 nm and 2 μm, as photonic devices in the structure 100 should transmit wavelengths within this range. The material transmittance should be better than 80% at the particular light wavelength used. The term "high-resistivity" should be understood to mean that the substrate or material at issue has low losses for electromagnetic waves at RF, mm wave and THz frequencies. Typical low and medium resistivity substrates have a resistivity of 0.005 and 10 Ω·cm, respectively. High-resistivity substrates have a resistivity higher than 30 Ω·cm, and typically, for best RF performance is higher than 1 KΩ·cm. The high-resistivity transparent substrate can be, for example, glass or sapphire.

The via-holes 121 in the prefabricated substrate 102 can then be electroplated or filled with a conductive material, such as copper or another suitable metal or other material to form the vias 122 to the VLSI structure 150. A first level of metal can be fabricated on the transparent substrate 102 top, enabling the connection of electrical or photonics components, as discussed above. Additional levels of metal can be added to construct more complicated structures such as MIM capacitors (e.g., capacitors 116), resistors, spiral inductors (e.g., inductors 114), antennas 118 and transformers. For example, an antenna 118, which can be a portion of an electronic device such as an RF receiver, RF transmitter or an RF transceiver, can be formed in the upper device layer 101 and can be subsequently coupled to the active device 110 in the VLSI structure 150 to complete the electronic device, as discussed in more detail herein below.

As noted above, preferably, the structures are prefabricated in the upper layer prior to transfer onto the VLSI structure to ensure that the structural integrity of the photonic or electronic components in the VLSI structure is maintained. The structures may also include photonic structures. For example, the laser source 120 may be attached to the surface of the substrate or may be inserted and attached to the substrate in one or more of the holes formed at step 204. The laser source 120 may be subsequently optically aligned with the waveguide 108 in the VLSI structure 150 to form a photonic device, as discussed in more detail herein below.

Figure 3:
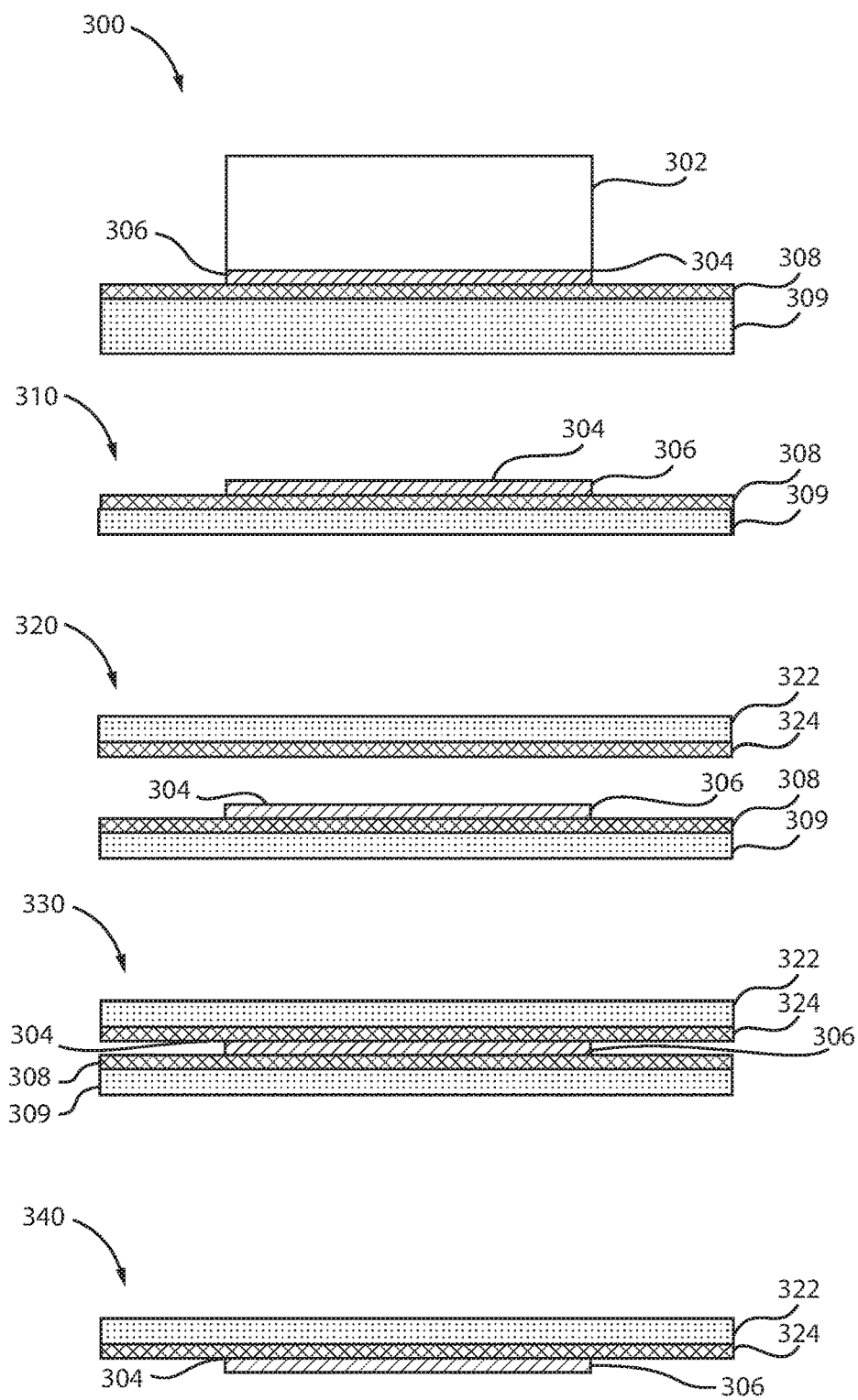
FIG. 3 shows etching and bonding with respect to VLSI structures, in accordance with an embodiment of the present principles.

At step 206, the VLSI structure can be mounted to a support structure. For example, the wafer or the chip front face of the VLSI structure 800 may be glued to a support structure composed of a transparent mechanical substrate, which can be, for example, glass. Chip sizes of the structure 800 can be between 1×1 mm$^2$ to 25×25 mm$^2$. In addition, wafer sizes, if the structure 800 is implemented in a wafer, can vary from 1 to 12 inches or more in diameter. Here the chip or wafer of the structure 800 can be bonded to glass with the device side down. For example, the top 107 of the VLSI structure or device layer 150 in FIG. 8 can be attached to the support structure, as illustrated in FIG. 3. Here, the structure 800 is represented by elements 302, 304 and 306 of the structure 300 of FIG. 3, wherein element 302 denotes the semiconductor layer 802, element 304 denotes the dielectric layer 104 and element 306 denotes the VLSI device layer 150. Here, the VLSI structure in either wafer form or chip form is bonded to a support structure, which can be carrier substrate 309 which, in turn, can be composed of, for example, glass, sapphire or silicon. This bonding can be accomplished using a polymer adhesive 308, such as polyimide or other light-absorbing material. Polyimide Adhesive (HD-3007) has been found to be a suitable adhesive. In general, a polymer glue 308 that is sensitive to a certain light wavelength $\lambda_{polymer}$ should be used. In a preferred embodiment, the adhesive 308 is coated on a borofloat glass 309 and cured. The adhesive can be cured in an inert gas atmosphere prior to chip/wafer attachment/bonding between the structure 800 and the support structure 309 to remove volatiles. The mechanical support wafer 309 used here is transparent at the light wavelength $\lambda_{polymer}$. Thus, the mechanical support, as noted above, can be a glass wafer, as it is transparent to the laser light that is provided on the glue polymer. Glass has also a thermal coefficient of expansion that is close to that of silicon (used in the chip/wafer), which is advantageous to reduce stress during process thermal cycles. Some other mechanical supports may be used, such as, for example, sapphire, as long as they are transparent to the laser wavelength. The polymer 308 can be coated onto either the carrier 309 or VLSI structure 800 by, for example, spin coating or other suitable means. The VLSI structure 800 is then joined to the support structure 309 and cured, as noted above.

The size of the mechanical glass substrate 309 can be any size from the chip size to a 200 mm, 300 mm, or 450 mm wafer size. Further, the pre-cure thickness of a polyimide adhesive 308 on a glass carrier 309 in this embodiment is between 6-10 µm. The wafer or chips can be adhered to the glass substrate with the adhesive layer 308 by applying uniform heat and pressure during the bond process to ensure that air is not trapped in the bond. For example, the temperature can be elevated to the reflow temperature of the adhesive, for example, 300° C. for 10 minutes if the polyamide adhesive is used, and then cooled slowly to room temperature.

At step 208, at least a portion of a semiconductor layer can be removed from a top portion of the VLSI structure. Here, the VLSI substrate 802 is removed from under the VLSI circuitry to expose the bottom surface of the circuitry. This removal can be accomplished by implementing one or more various techniques, such as etching, mechanical polishing, grinding, or any combination of these techniques. The etching can be implemented by performing mechanical etching, chemical etching and/or plasma etching. For example, reactive ion etching, $XeF_2$ vapor etching, or wet chemical etching can be performed. For $XeF_2$ vapor etching, a complete silicon etch can involve removal of the silicon repeatedly using between 400-1000 "cycles," depending on the thickness of silicon and square area, until the back side of the SOI circuitry is exposed. The etch rate for silicon is volume dependent. Generally, a single cycle time is ~30 seconds. Exposed edges of the chip(s) should be protected prior to etching with a resist to prevent side etching and undercutting within the device circuitry in the VLSI structure 150 during etching. An advantage of using an SOI structure is that the silicon chemical or plasma etching is very selective with respect to $SiO_2$ of the insulator layer 308, enabling the etching process to be stopped automatically at the appropriate distance without damaging the devices integrated into the VLSI device layer 150 and isolated from the substrate by the $SiO_2$ box 318. For the structure 800 illustrated in FIG. 8, the etching stops at dielectric layer 104 beneath the VLSI layers. For example, the chip or wafer of the structure 800 can be flipped and the silicon substrate 802 above the $SiO_2$ BOX 104 can be etched away. For example, as illustrated by structure 310, the semiconductor substrate 302 has been etched and removed from the VLSI structure 800, where the etching stops at the BOX layer 104. In accordance with one exemplary aspect, additional processing on the back side of the VLSI layers can be performed while the VLSI device layer 150 is held by the carrier wafer 309. Here, the back side of the VLSI layers can be the side of the device layer 150 that interfaces with the dielectric layer 104. For example, additional vias 123, illustrated in FIG. 1, can be formed through the dielectric layer 104 to make contact to metal, such as metal forming the active device 110, buried within the VLSI stack 150.

Figure 19:
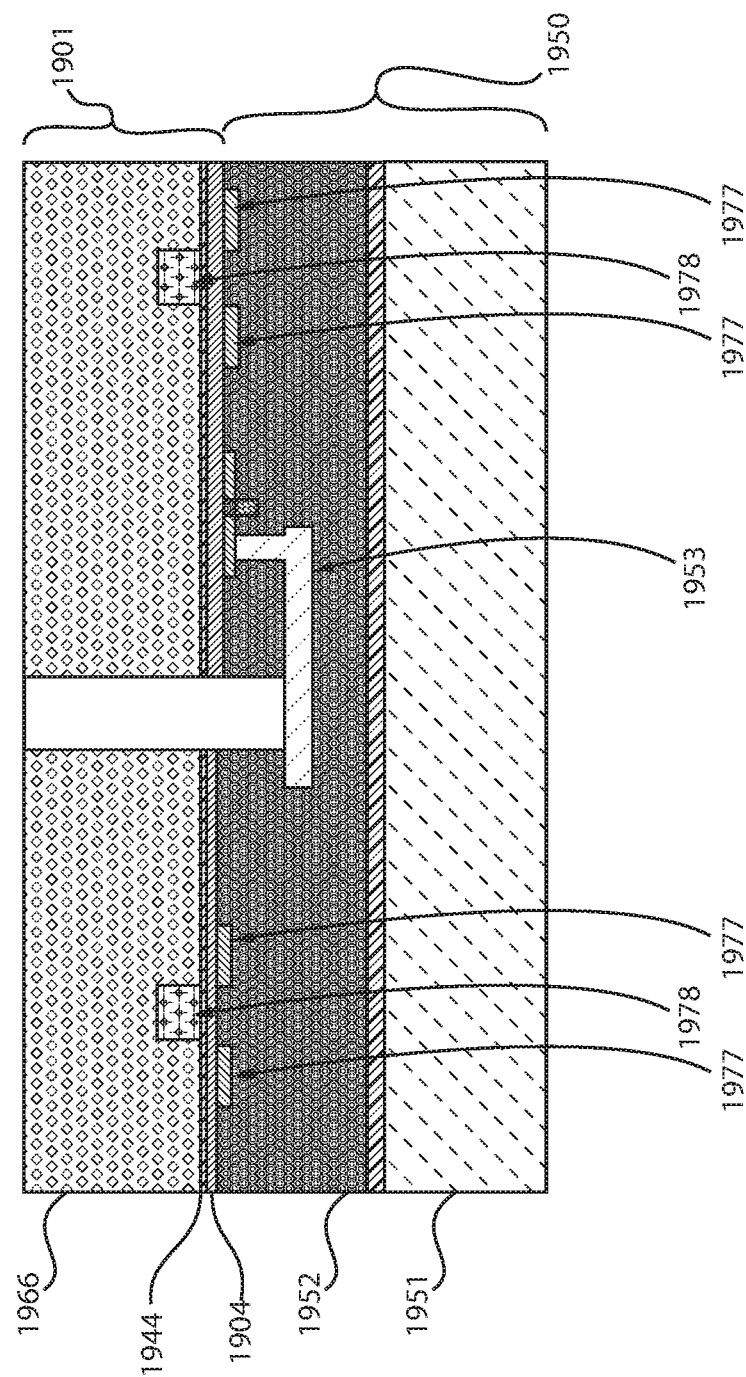
FIG. 19 is a cross-sectional view of a VLSI structure 1950 having a pre-fabricated transparent device layer 1901 aligned there with using alignment marks 1977, in accordance with an embodiment of the present principles.
Figure 20:
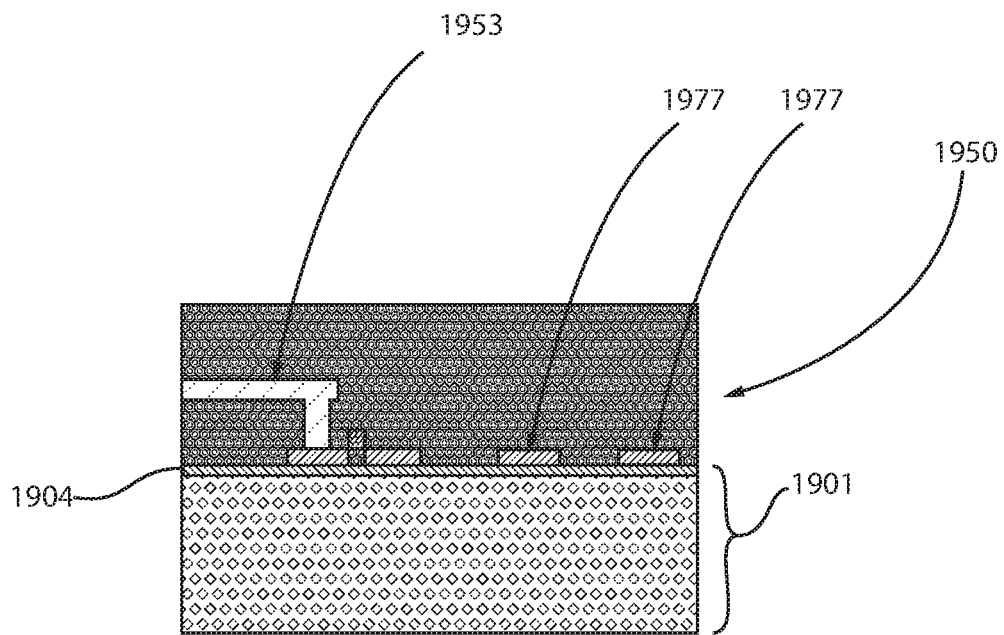
FIG. 20 is an inverted partial cross-sectional view of the VLSI structure 1950 having a pre-fabricated transparent device layer 1901 aligned there with using alignment marks 1977 shown in FIG. 19, in accordance with an embodiment of the present principles.
Figure 21:
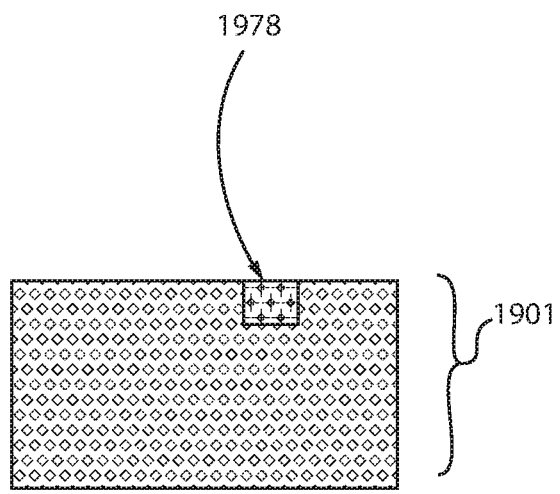
FIG. 21 is a cross-sectional view of the pre-fabricated transparent device layer 1901 shown in FIG. 19, in accordance with an embodiment of the present principles.

At step 210, the upper device layer 101 formed at step 204 can be attached to the top of the VLSI structure. For example, if the VLSI structure 150 were employed, the top 103 of the dielectric layer 104 illustrated in FIG. 1 would constitute the top of the VLSI structure here. To implement step 210, the pre-fabricated transparent device layer 101 is aligned to the VLSI chip 150 or wafer of the VLSI chip 150 using alignment marks placed on the transparent substrate and VLSI chip or wafer. The chip or wafer 150 is then attached to the prepared transparent structure 101 using bonding or an adhesive. Solder bonding can be employed to electrically connect the vias 121 to the VLSI circuits. This enables the connection of the electrical and photonics components on the top of the prefabricated upper layer structure 101, such as, for example, elements 114, 116, 118 and 120, to the VLSI circuits in the VLSI layer 150. As noted above, surface mount devices are soldered to the top of the layer 102 in the upper device layer. For example, as noted above, an antenna 118 in the upper device layer 101 can be electrically coupled to the active device 110 in the VLSI structure 150 to form an electronic device, such as an RF receiver, an RF transmitter, or an RF transceiver. In addition, the laser source 120 in the upper device layer 101 may be optically aligned with the waveguide 108 in the VLSI structure 150 to form a photonic device using the alignment marks. The waveguide 108 is formed of a silicon film below the dielectric layer 104. FIGS. 19-21 below further describe the aforementioned alignment.

Structures 320 and 330 in FIG. 3 illustrate the bonding of the upper device layer 101 with the VLSI structure 150, where the layer 322 denotes the upper device layer 101, layer 304 denotes the VLSI structure 150, and layer 324 denotes an adhesive which can be a polyamide adhesive with a thickness of 2-3 µm. The polyamide adhesive discussed above with respect to step 206 can be employed to attach the upper device layer 101 to the VLSI device layer 150. Here, the upper device layer 101 is attached to the backside 103 of the VLSI device layer 150. It should be noted that the attachment at step 210 is important, as any voids in the bond 324 between the upper device layer 101 and the VLSI structure 150 can cause device fracturing either during bonding or during release from the support structure 309, discussed herein below with respect to step 212.

As discussed above with respect to step 206, the adhesive 324 can be cured in the same way in an inert gas atmosphere prior to chip/wafer bonding to remove volatiles. The exposed SOI bottom layer 304 can then be placed onto the adhesive layer 324 on upper device layer 322, ensuring air is not trapped. Any voids can cause device fracturing either during bonding or during laser release. As discussed above with respect to step 206, this can be accomplished by applying uniform heat and pressure during the bonding process. For example, the temperature can be elevated to the reflow temperature of the adhesive, for example, 300° C. for 10 minutes under a pressure of greater than 10 PSI if the polyamide adhesive is used, and then cooled slowly to room temperature to form the bond between the upper device layer 101/322 and the VLSI device layer 150/306.

The VLSI circuitry 150 is now integrated with the desirable end-product substrate 102, which can be a transparent, highly insulating substrate, as discussed above, for the purposes of avoiding light loss or enhancing optical properties of the substrate to reduce electrical signal losses due to the high resistivity. As noted above, the bonding can be implemented using a polymer, such as polyimide or other light-absorbing material. The polymer can be coated onto either the improved substrate 102 or the VLSI substrate 150 on the carrier wafer 309 by spin coating or any other suitable method. The VLSI device layer 150 is then joined to the desired substrate 101 and cured, as noted above.

Figure 4:
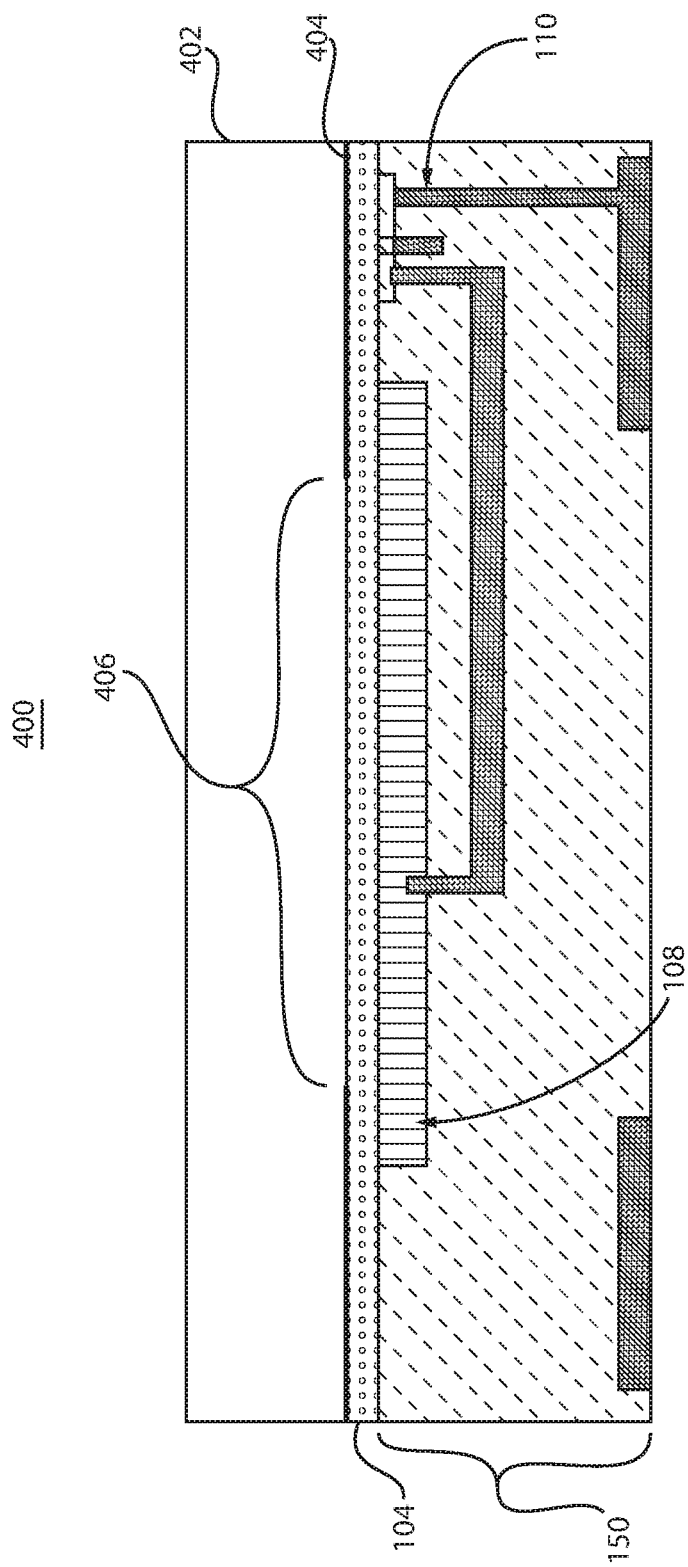
FIG. 4 is a cross-sectional view of an exemplary VLSI structure showing transparent substrate attachment using adhesive bonding, in accordance with an embodiment of the present principles.

In accordance with an alternative embodiment, at step 210, a patterned adhesive can be employed to bind the VLSI device layer 150 and the upper device layer 101. For example, structure 400 of FIG. 4 illustrates the attachment between the VLSI device layer 150 and an upper device layer 402 using a patterned adhesive, where element 402 can represent, for example, upper device layer 101. Here, the adhesive 404 can be patterned under a photonic device or a portion of a photonic device, such as a photonic waveguide 108, so that no adhesive is disposed over the photonic components in the VLSI device layer 150 that should maintain an optical coupling with other photonic components disposed in the upper device layer 101, such as, for example, a laser source or an optical fiber end, among other components. Thus, in this way, the adhesive can provide windows 406 to ensure that optical couplings between photonic components in the VLSI device layer 150 and in the upper device layer 101. The adhesive here can be a different adhesive than that described with respect to FIG. 3 or can be the same adhesive. Regarding the patterning, after spin-coating of the adhesive, it is soft-baked. A resist mask is then spin-coated on top. The resist is then exposed to light and developed. The pattern is transferred to the adhesive by using dry etching.

Figure 5:
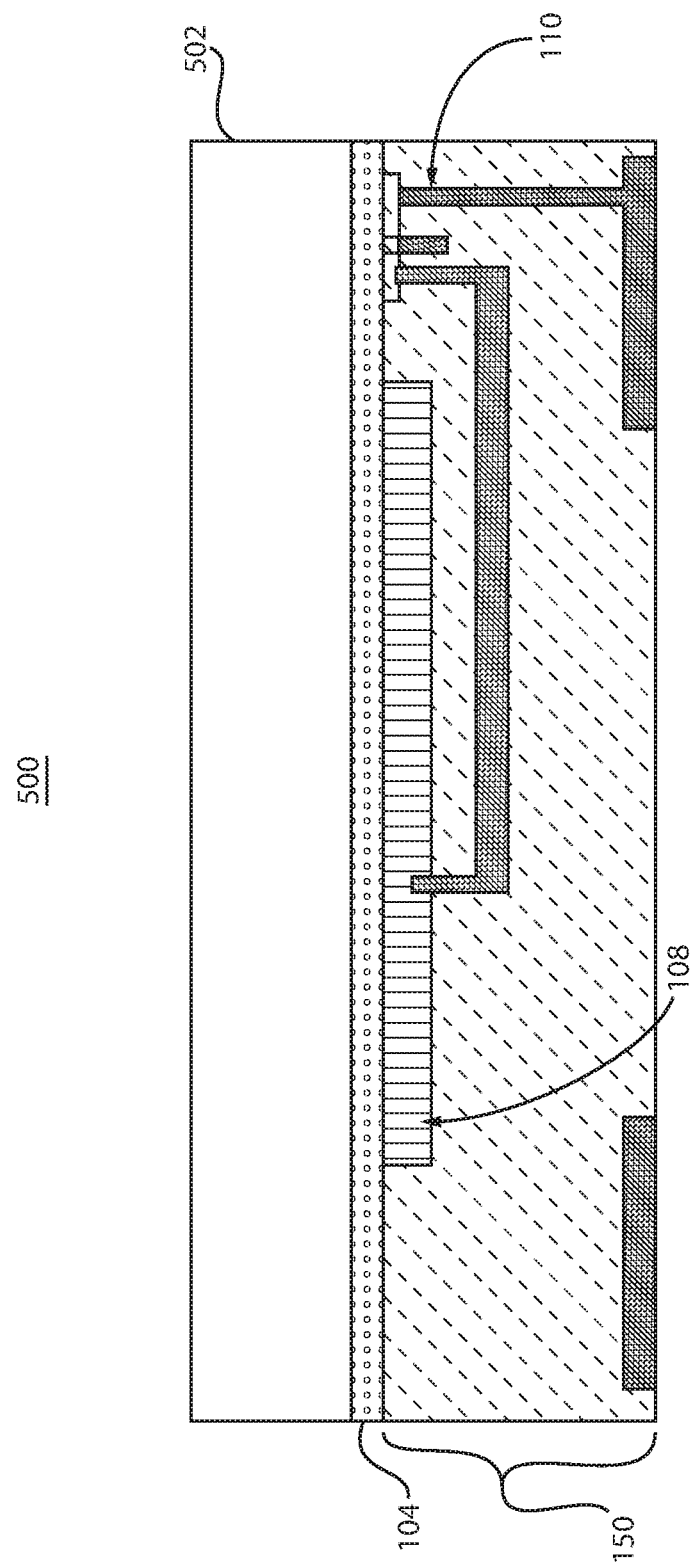
FIG. 5 is a cross-sectional view of an exemplary VLSI structure showing transparent substrate attachment using direct bonding, in accordance with an embodiment of the present principles.

In accordance with another exemplary embodiment, the attachment between the VLSI device layer 150 and the upper device layer 101 performed at step 210 can be implemented through direct bonding. For example, if the material 102 in the upper device layer 101 is a glass or quartz substrate, then the upper device layer 101 can be bound on perfectly flat surfaces. Structure 500 of FIG. 5 illustrates the direct bonding of the upper device layer 101, represented by element 502, to the VLSI structure 150 by using very smooth surfaces.

At step 212, the VLSI structure can be released from the support structure. Here, the support structure or carrier wafer 309 is then removed from the VLSI circuitry, such as by chemical means or laser illumination. For example, as illustrated by structure 340 in FIG. 3, due to the transparent nature of the support structure 309, the interface between the VLSI structure 306 and the adhesive 308 can be irradiated with laser light to release the VLSI structure 306, which denotes the VLSI device layer 150. In particular, the support 309 and polymer adhesive 308 can be irradiated with a light having a wavelength $\lambda_{polymer}$ to which the adhesive is sensitive. For example, the adhesive 308 can be irradiated through the support wafer 309 with an appropriate laser wavelength and energy to break the bond between the support wafer 309 and the VLSI device layer 306. For example, if the support structure is composed of glass, a 308 nm excimer laser at 500 mJ, at 16%-18%, power can be used if a polyamide adhesive is employed as adhesive layer 308. Alternatively, if the support structure 309 is silicon, an infrared laser can be employed. In this example, four passes of the laser should be sufficient to break the bond. The carrier 309 can then be removed from the device layer 306 and the adhesive layer 308 residue can be cleaned by reactive ion etching, chemical cleaning or laser removal to expose the original top of the circuitry of the device layer 306/150. For example, nitride masked polishing and/or some other technique and/or product can be employed to remove the adhesive residue.

Figure 6:
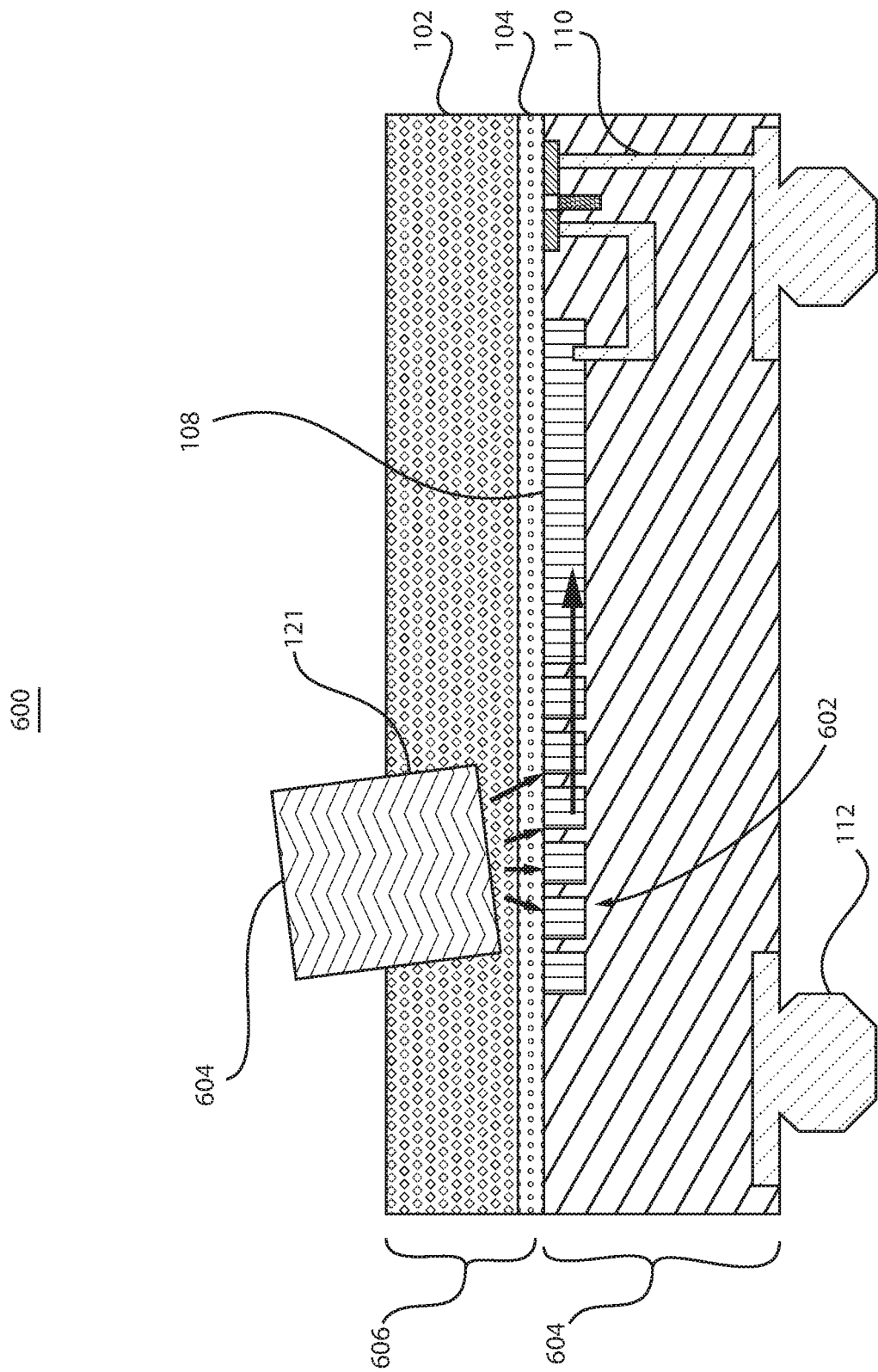
FIG. 6 is a cross-sectional view of an exemplary VLSI structure showing a transparent substrate with optical fiber attachment, in accordance with an embodiment of the present principles.
Figure 7:
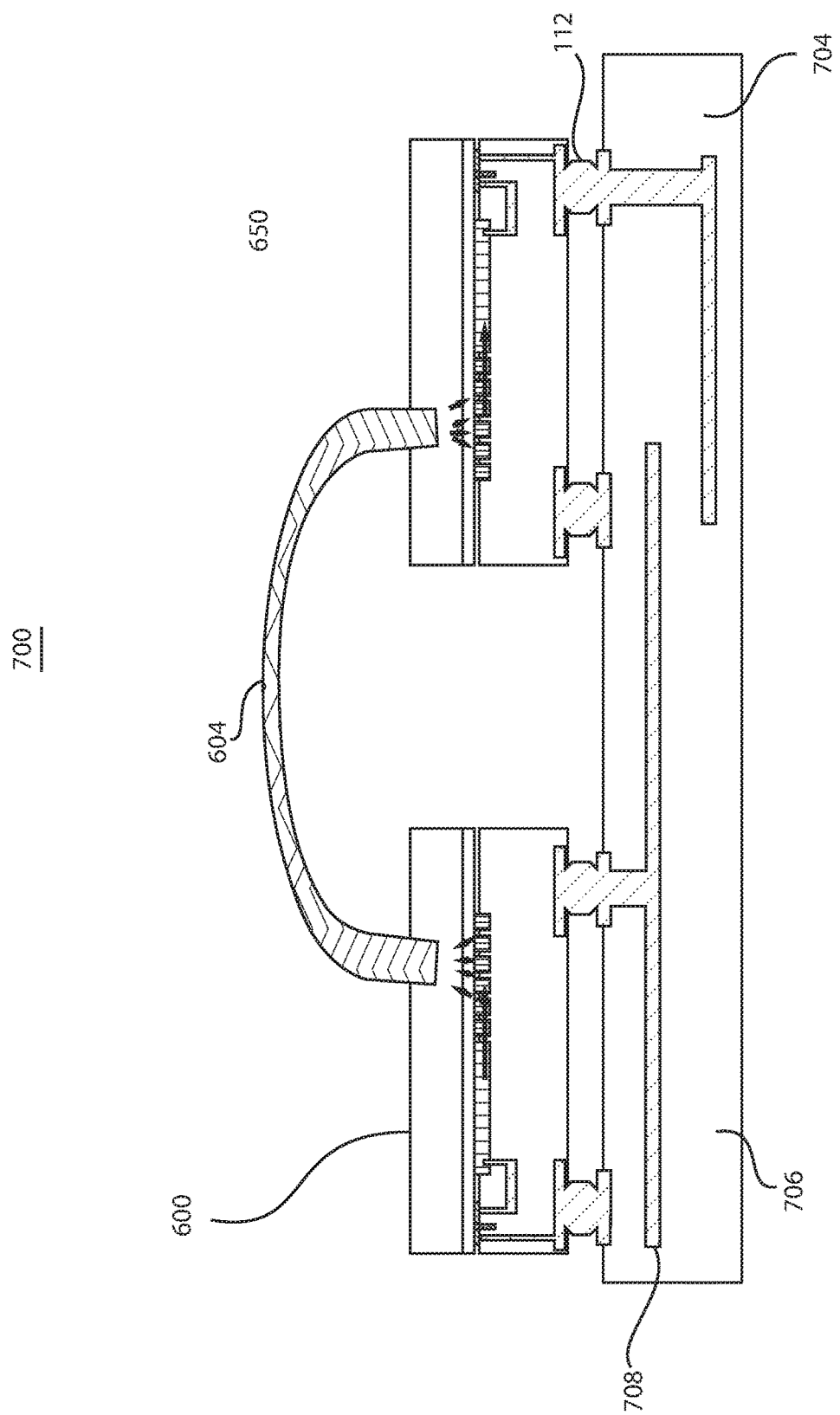
FIG. 7 is a cross-sectional view of exemplary VLSI structures showing chip to chip communication using optical fiber, in accordance with an embodiment of the present principles.

At step 214, the fabrication of the VLSI structure can be completed. For example, at step 216, one or more portions of a photonic device and/or an electronic device can be formed in the upper layer. Here, as opposed to forming the photonic structures and/or the electronic structures, such as structures 116, 114, etc., in the upper device layer substrate 102 at step 204, as discussed above, these structures may be formed subsequently, after the substrate 102 is formed and the VLSI structure is released from the support structure 309. Alternatively, the photonic structures and/or the electronic structures may be formed while the VLSI structure 150 is attached to the support structure 309. For example, the holes 121 may be prefabricated in the substrate 102 at step 204 as discussed above, and the vias 122, antenna 118, capacitor 116, inductor 114 can be formed in the holes 121 and/or on the substrate 102 at either step 210 or 214 and aligned properly with corresponding elements in the VLSI device layer 250 to form electronic devices as discussed above. Similarly, portions of photonic devices can be formed in the substrate 102 at steps 204, 210 or 214. For example, at step 218, an optical component can be inserted and/or attached to the upper device layer 101. For example, a laser source 120 can be attached in one or more holes 212 formed in the upper device layer 101 or can be attached to the top surface of the upper device layer 101 and aligned with the waveguide 108 to form a photonic device, as discussed above with respect to step 210. In addition, an optical fiber can be attached in one or more holes 212 formed in the upper device layer 101 or can be attached to the top surface of the upper device layer and aligned with a grating coupler to form a photonic device. For example, as illustrated in FIG. 6, an optical fiber 604 can be inserted into a hole 121 in the upper device layer 606. Similarly, the optical fiber 604 can be inserted within the upper device layer 101 in lieu of, or in addition to, the laser source 120. Here, the optical fiber 604 can be attached to the hole 121 with an adhesive and is optically coupled to the photonic waveguide 108 through a grated coupler 602, which can be formed in the VLSI structure 604 during step 202 and aligned with the optical fiber 604. Here, the optical fiber 604, grated coupler 602, and the photonic waveguide 108 can collectively form a photonic transmission device. The grated coupler 602 can be formed of a silicon film below the dielectric layer 104 using VLSI techniques. It should be noted that the VLSI structure 150 can also be modified to include the grated coupler 602, thereby forming the VLSI structure 604. Thus, by employing an optical fiber in this way, chip-to-chip communication can be implemented. For example, as illustrated in FIG. 7 the optical fiber 604 can couple the structure or chip 600 to another VLSI structure or chip 650 formed in the same or a similar as structure 600 or VLSI structure 100, modified to accommodate the fiber with a grated coupler 602.

Figure 9:
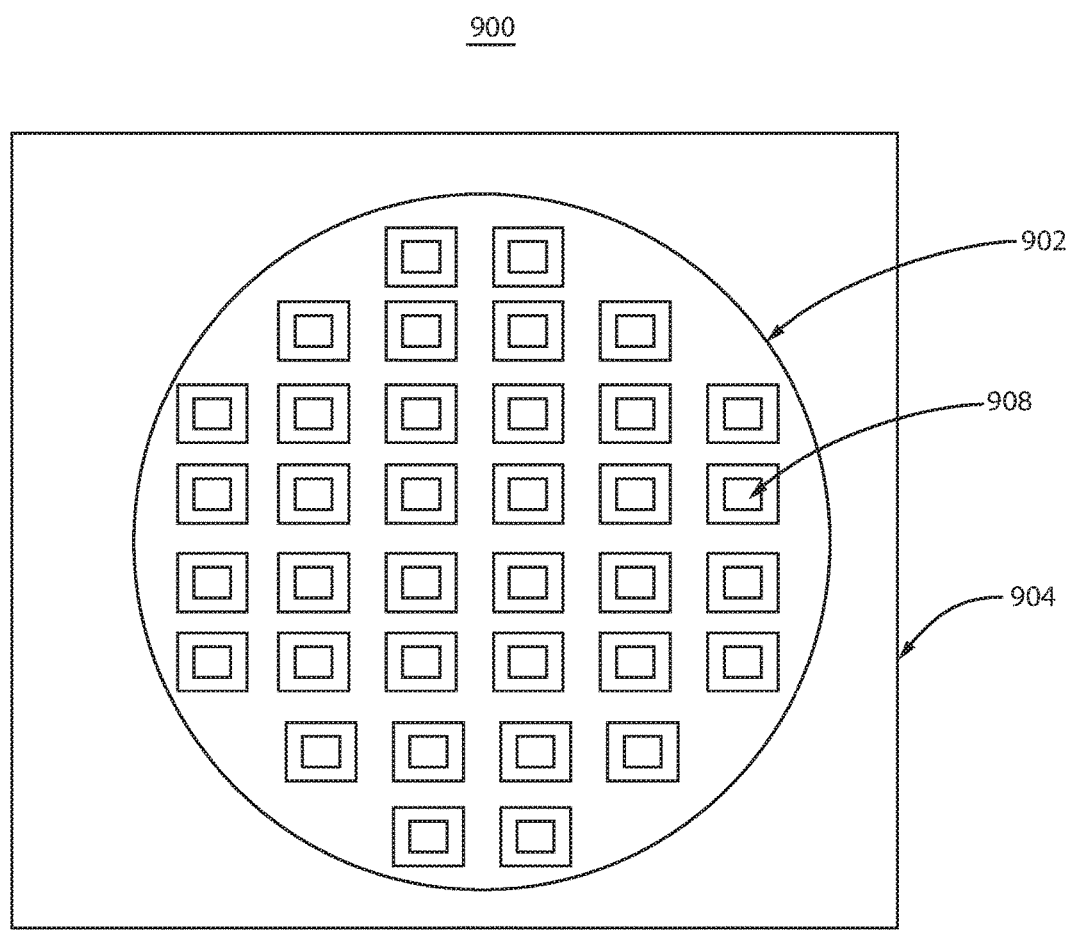
FIG. 9 is a top view showing an implementation in which a VLSI structure is part of a wafer, in accordance with an embodiment of the present principles.

At step 220, the bottom of the VLSI structure can be attached to another chip, a carrier-wafer, an interposer, or a board. For example, as noted above connectors 112 can be employed to attach the structure 100 or the structure 600, each of which can be an individual chip or part of a larger wafer, to a wafer including an integrated circuit. For example, as illustrated in FIG. 7, the structure 100 or the structure 600 can be attached to a wafer 706 including a dielectric material 704 and electrical circuit components 708 through which the devices in structure 100 or 600 can be powered and with which the devices in structure 100 or 600 can communicate through the coupling elements 112. FIG. 9 illustrates a top view of an alternative implementation in which the VLSI structure is part of a wafer. For example, a VLSI structure 908, which can be structure 100 or structure 600, can be part of a wafer 902 and attached to a wafer 904, which can be wafer 706, through connectors 112. Here, the wafer 902 can include hundreds, or more, VLSI structures 908. A typical wafer dimension is between 200 mm and 300 mm in width and/or length, such as wafer 902 in the top view shown in FIG. 9.

Figure 10:
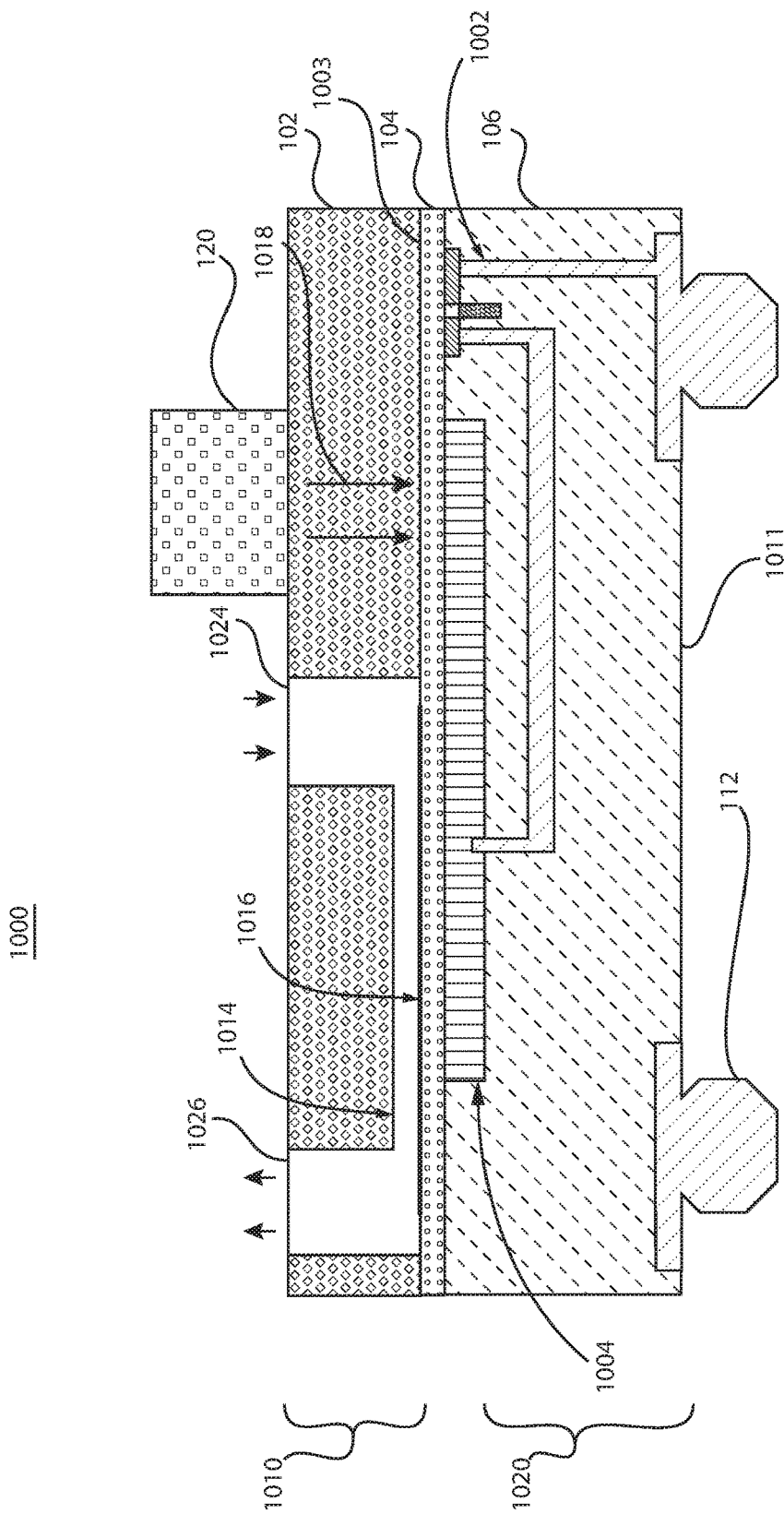
FIG. 10 is a cross-sectional view of an exemplary packaged chip and refractive-index sensor with a vertical-cavity surface-emitting laser on top, in accordance with an embodiment of the present principles.

Referring now to FIG. 10, an exemplary embodiment of a refractive index optical sensor 1000 constructed, at least in part, with VLSI technology is illustratively depicted. In particular, the optical sensor structure 1000 can be formed in accordance with an exemplary embodiment of the method 200, as discussed in more detail herein below. Here, the optical sensor 1000 can include a channel layer 1010 which, in turn, includes a micro-fluidic channel 1014 in which a liquid or gas can flow into end 1024, interact with a binding layer 1016, and flow out of end 1026. The micro-fluidic channel 1014 can be formed in the relatively transparent and high-resistivity substrate 102 discussed above. Here, a laser source 120, such as a VCSEL, can be attached to the top of the channel layer 1010. In addition, the sensor structure 1000 can include a VLSI device layer 1020, which can be formed in accordance with VLSI technology, similar to the VLSI device layers discussed above. As indicated above, the VLSI device layer 1020 and the structure 1000 can be a single chip or part of a larger wafer. The VLSI device layer 1020 includes a photonic waveguide 1004, an active device 1002 and a ring resonator (not shown in this view), described herein below. The VLSI device layer 1020 can be insulated with a dielectric layer 106, similar to the VLSI devices layers described above. The light 1018 from the laser source 120 can be transmitted through the transparent material 102 and into the photonic waveguide 1004 for further processing in accordance with various implementations. As discussed herein below, to fabricate the structure 1020, the wafer or the chip front face is glued to a transparent mechanical substrate which can be, for example, glass. The chip can be flipped and the silicon substrate above the dielectric layer 104 is etched away. As discussed herein below, a transparent substrate (typically glass) is prepared with microfluidic channels 1014. The photonic sensor is functionalized by patterning a binding layer 1016 such that after assembly, the binding layer 1016 is within the microfluidic channel 1014. The chip or wafer is then attached to the prepared transparent substrate using bonding or adhesive. FIG. 10 illustrates an example in which a laser source 120 transmits light to a photonic waveguides 1004, which can be composed a silicon film below the dielectric layer 104. The light is coupled to the silicon photonic wave guide using a grating coupler. Solder bonding can also be used to electrically connect TGVs to the VLSI circuits (not shown here), as discussed above with respect to structures 100, 600 and 700. This permits an electrical connection to the laser source 120 on the top of the prepared transparent substrate to the VLSI circuits, thus DC power can be provided to the laser source. Further, the VLSI device layer 1020 can be connected to a board or wafer via connectors 112, which can be C4 balls.

Figure 11:
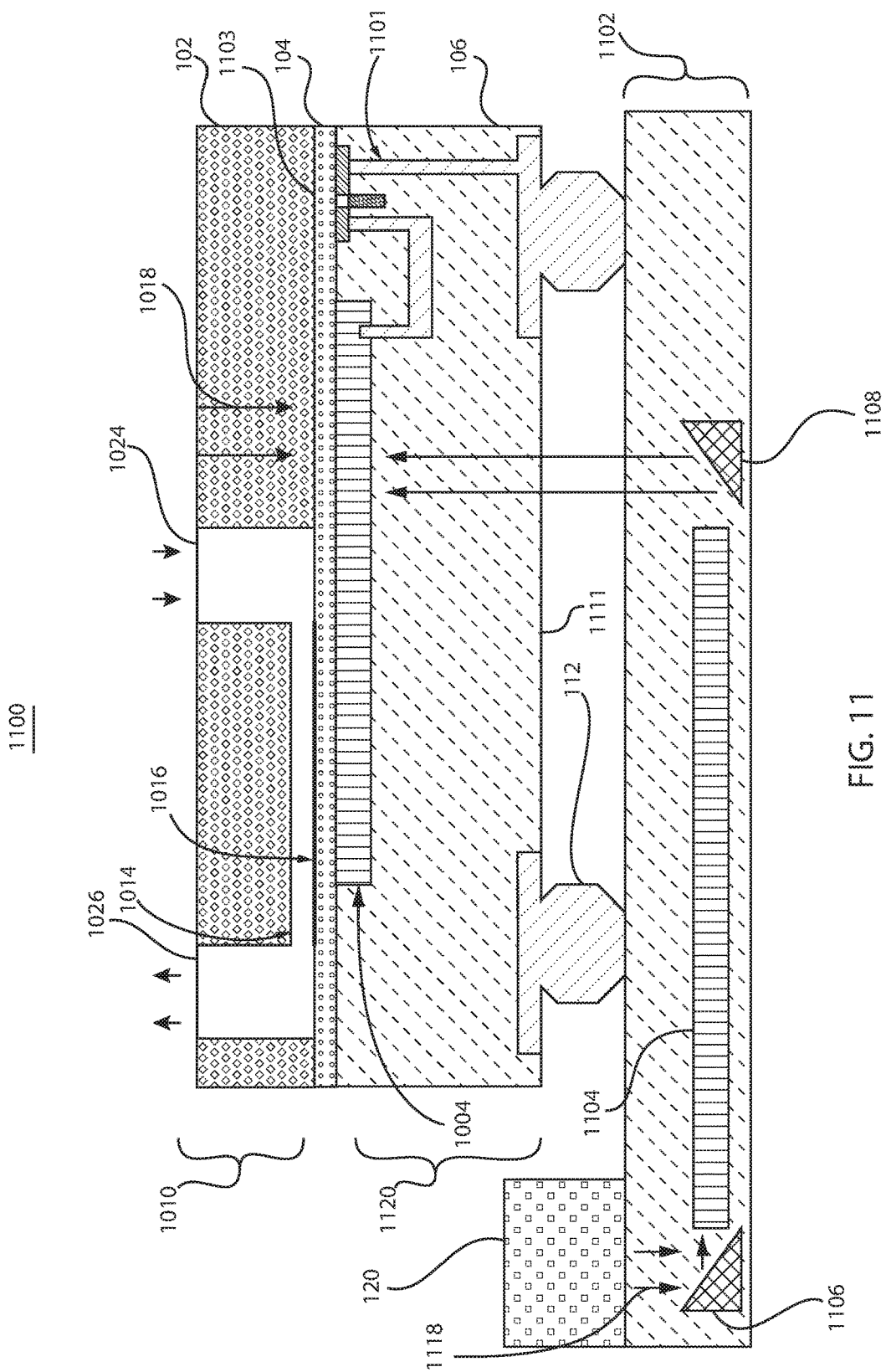
FIG. 11 is a cross-sectional view of an exemplary packaged chip and refractive index sensor with a vertical-cavity surface-emitting laser on board, in accordance with an embodiment of the present principles.

FIG. 11 illustrates an optical sensor structure 1100 that is similar to the structure 1000, except that the laser source 120 is attached to the board 1102 as opposed to the top of the chip or wafer in FIG. 10. In addition, the active device 1101 is configured so that light 1118 from the laser source 120 can traverse through the material 106 without intercepting the conductive material, for example copper or other suitable metal of the active device 1101/1002. Here, as illustrated in FIG. 11, the light 1118 is brought to the chip using mirrors 1106 and a photonic waveguide integrated to the board 1102. The light is coupled to the photonic waveguide 1004 using a grating coupler.

Figure 12B:
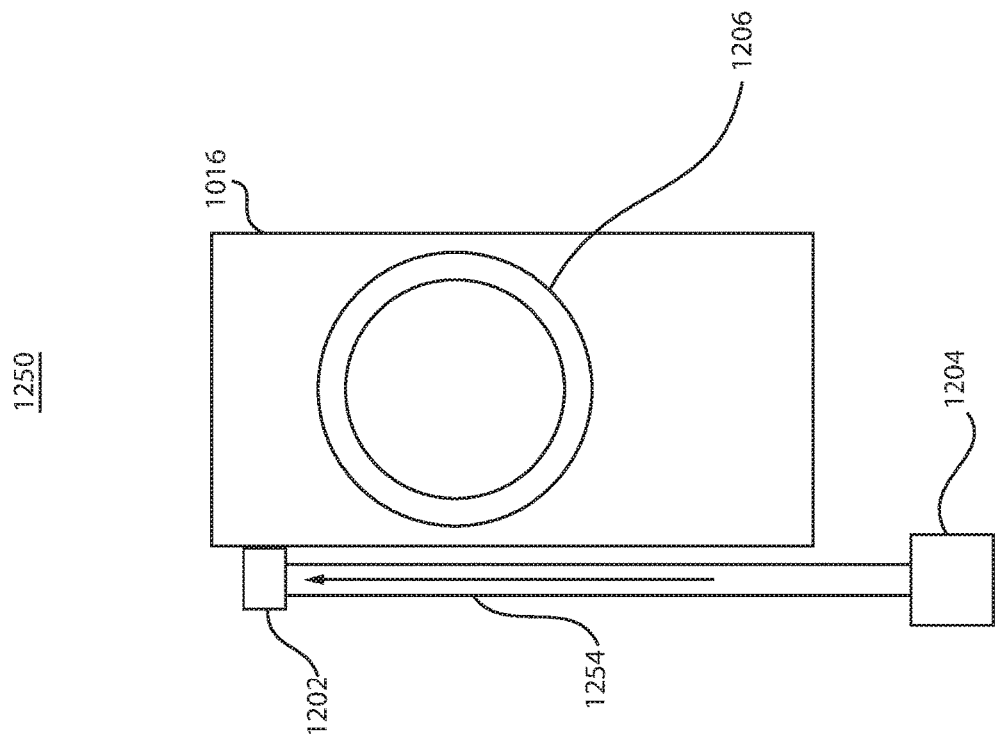
FIGS. 12A and 12B are a top view of a packaged chip and refractive-index sensor, in accordance with an embodiment of the present principles.
Figure 12A:
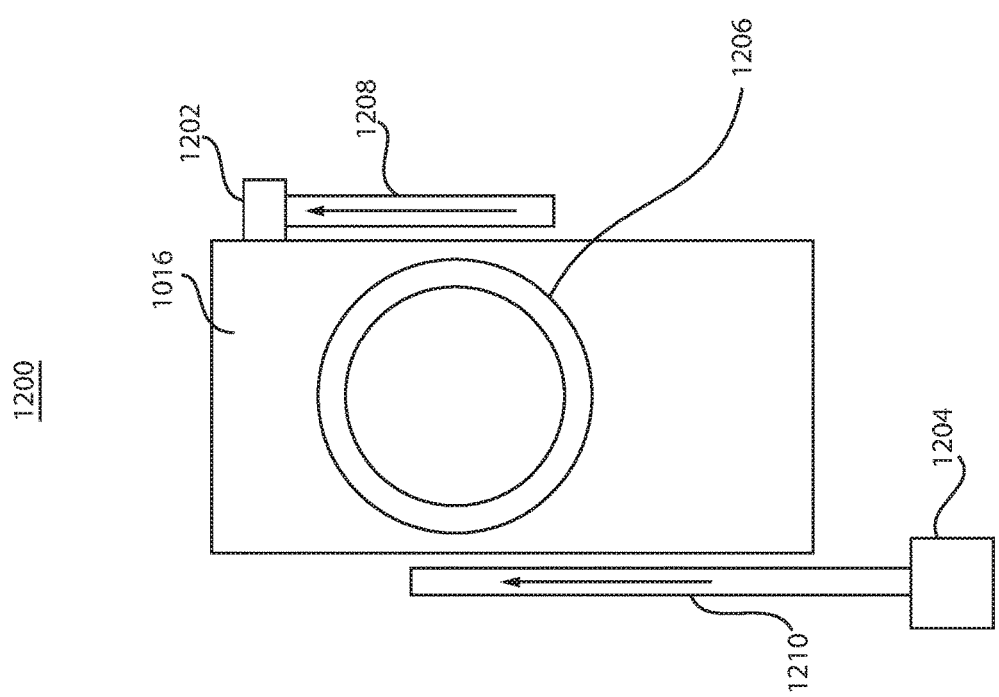

FIGS. 12A and 12B provide a top view of sensor structures 1000 and 1100 cross-sectioned at the binding layer 1016 in structures 1000 and 1100. The ring resonator 1206 is composed of a semiconductor material and formed in the semiconductor layer, for example composed of silicon and formed in a silicon layer, in which the photonic waveguides 1004 are formed, under the dielectric layer 104 in the views depicted in FIGS. 10 and 11. Here, the optical sensors 1000 and 1100 can be used to detect the presence of a target molecule. For example, in each of the structures 1200 and 1250 illustrated in FIGS. 12A and 12B respectively, a liquid or gas can be transmitted through the micro-fluidic channel 1014. If the target molecule is in the liquid or gas stream and binds to the binding layer 1016, then the refractive index above the ring resonator 1206 changes. Therefore, the resonator 1206 resonant frequency is shifted to a different frequency. The light is coupled to the ring resonator 1206 externally with a grating coupler and propagates through the photonic waveguide prior to reaching the ring resonator 1206. Any light that has a frequency that equals the resonant frequency of the ring resonator 1206 is then coupled into the ring resonator.

For example, in structure 1200 in FIG. 12A, which can be implemented in structures 1000 or 1100, light from the laser source 120 in either structure 1000 or 1100 is transmitted to the grating coupler 1204 and into to the photonic waveguide 1210, which is one implementation of the photonic waveguide 1004. The grating coupler 1204 can be formed of a semiconductor material in a semiconductor layer, such as silicon in a silicon layer, similar to the photonic waveguide 1004 Here, photonic waveguide 1210 is coupled to the ring resonator 1206, and only light passing through the photonic waveguide 1210 that has a frequency that is equal to the resonant frequency of the photonic resonator 1206 is transmitted through the ring resonator 1206 and, in turn, is also transmitted through the photonic waveguide 1208, which can be formed in the same manner as the waveguide 1210, on to the photodiode 1202. Further, the photodiode 1202 detects the presence of the light. The laser wavelength can be chosen such that the light passes through the ring resonator 1206 and excites the photodiode 1202 when no target molecules are present. Thus, when a target molecule propagates through the micro-fluidic channel 1206, the target molecule binds to the binding layer 1016 and changes the refractive index above the ring resonator 1206. Such a change in refractive index shifts the resonator resonant frequency, as noted above. The light cannot couple through the ring 1206 and, therefore, does not go through the ring. The photodiode is not excited, which indicates the presence of a target molecule. Alternatively, the frequency of the laser source 120 and/or the composition of the binder can be selected such that the refractive index above the resonator 1206 changes the resonant frequency of the resonator 1206 such that the resonant frequency is equal to the frequency of the laser light emitted by the laser source 120 only if the target molecule is present. Thus, the presence of the target molecule is detected when the photodiode 1202 is excited with light.

FIG. 12B illustrates an alternative structure 1250, which can be implemented in structures 1000 or 1100. Here, light from the laser source 120 in either structure 1000 or 1100 is transmitted to the grating coupler 1204 and into the photonic waveguide 1254, which is one implementation of the photonic waveguide 1004. The structure 1250, in particular, the photonic waveguide 1254 and the ring resonator 1206, is configured to block light having a wavelength that is equal to the resonant frequency of the ring resonator to the photodiode 1202. The laser frequency of the light source 120 can be chosen such that it is equal to the ring resonant frequency when the target molecule is absent in the micro-fluidic channel. In that case, all of the light couples into the ring 1206, no light reaches the photodiode 1202, and the photodiode 1202 does not generate an electrical signal, indicating that the target molecule is absent. When a target molecule propagates through the micro-fluidic channel 1014, the target molecule binds to the binding layer 1016 and changes the refractive index above the ring resonator 1206. The change in refractive index above the resonator shifts the resonator resonant frequency. Thus, the light from laser source 120 cannot couple to the ring, and therefore continues to propagate to the photodiode 1202. Here, the photodiode 1202 generates an electrical signal that can be detected by the mixed-signal circuit integrated on the chip or wafer 1000 or 1100, which indicates the presence of the target molecule. The structure 1250 can be used as a complement with the first embodiment of the structure 1200 in the same device to test the presence or absence of a target molecule. For example, the same liquid or gas can be passed through different micro-fluidic channels that are respectively above the structures 1200 and 1250 to provide two different confirmations of the presence or absence of a target molecule.

It should also be noted that a frequency tunable laser can also be used as a laser source 120 as well as two micro-fluidic channels 1014 within a single chip/wafer 1000/1100. By closing one micro-fluidic channel 1014 to the target molecule, and opening the other one, a differential measurement can be performed on the photodiodes 1202. The laser light can be split and coupled to two grating couplers to bring light to both detectors. The laser light frequency can be swept and if the target molecule is absent, both photodiodes are always on or off. Alternatively, when the target molecule is present, a photodiode will be on while the other will be off at the resonant frequency. Such differential measurement technique does not require knowing the resonant frequency and therefore enables the detection of the target molecule even if environmental conditions, such as temperature change over time.

Figure 13:
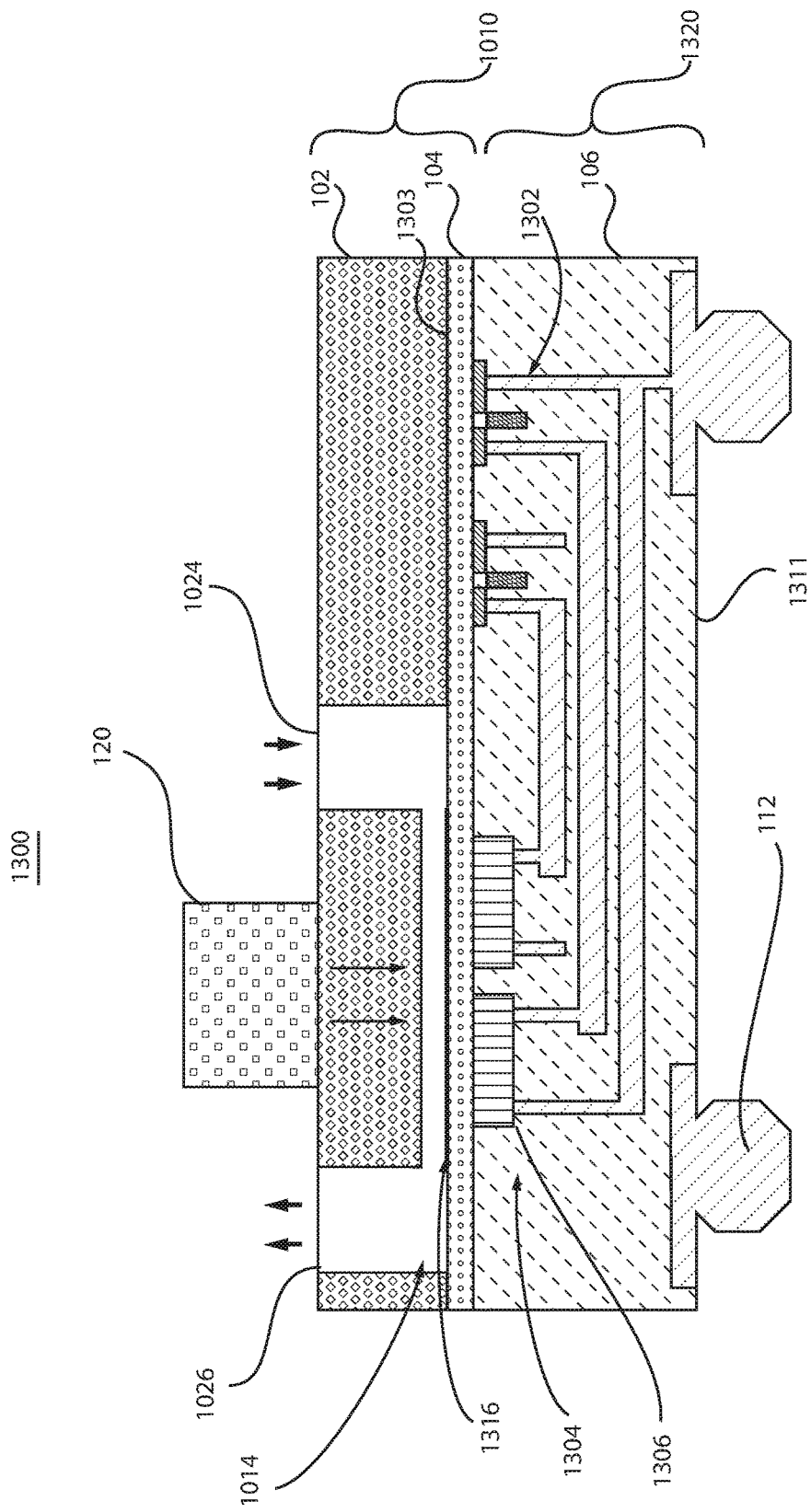
FIG. 13 is a cross-sectional view of a packaged chip and fluorescence-based sensor, in accordance with an embodiment of the present principles.

Referring now to FIG. 13, another embodiment of an optical sensor 1300 is illustratively depicted. FIG. 13 illustrates how a fluorescence-based sensor can be integrated in a single-chip. The goal of a fluorescence-based sensor is to detect a molecule that was marked with a fluorescent marker. Fluorescent labeling is accomplished using a chemically reactive derivative of a fluorophore. Common reactive groups include the following:

Isothiocyanate derivatives such as FITC and TRITC (derivatives of fluorescein and rhodamine) are reactive towards primary amines to form a thioureido linkage between the compound of interest and the dye.

Succinimidyl esters such as NHS-fluorescein are reactive towards amino groups to form an amido bond.

Maleimide activated fluorophores such as fluorescein-5-maleimide readily react with sulfhydryl groups. The sulfhydryl group adds to the double bond of the maleimide.

In oligonucleotide synthesis, several phosphoramidite reagents containing protected fluorescein and other fluorophores are reacted with hydroxy groups to allow the preparation of fluorophore-labeled oligonucleotides.

Reaction of any of these reactive dyes with another molecule results in a stable covalent bond formed between a fluorophore and a labeled molecule.

Such a technique can be used, for example, in cancer research and for nucleic acid detection. The operating principle is as follows: when a fluorescent-marked molecule goes to the micro-fluidic channel 1026, the fluorescent marker gets excited by the laser light emitted by laser 120, absorbs the light and emits light at a longer wavelength. The photodiode array 1304 detects the fluorescent light. As shown in FIG. 13, the wavelength filter(s) 1316 is disposed perpendicularly above the photodiode array 1304. The photodiodes 1306 of the array 1304 are integrated in the silicon film, and the absorption wavelength is between 190 and 1100 nm. One or more thin-film wavelength filters 1316 transmit light in a narrow wavelength-range and can be placed in front of each photodiode. As illustrated in FIG. 13, at least one wavelength filter 1316 is disposed perpendicularly below the microfluidic channel(s) 1014 and a laser source 120 is disposed perpendicularly above the microfluidic channel(s) 1014. By changing the thin film filter 1316 in front of each photodiode 1306, different wavelengths can be detected by the photodiode array 1304. This enables the sensor structure 1300 to detect several fluorophores, such as for example, red or green emitting quantum dots.

Referring again to FIG. 2, with continuing reference to FIGS. 10-13, it is noted that in accordance with one or more exemplary embodiments, the method 200 can be performed to fabricate optical sensors. The method can begin at step 202, at which a preliminary VLSI structure can be formed. For example, an SOI VLSI chip or wafer can be fabricated using VLSI methods. Here, the structures 1020, 1120, and 1320 illustrated in FIGS. 10, 11 and 13, respectively can be formed using VLSI methods. Structures 1020, 1120, and 1320 can be formed above a BOX layer, which is one example of the dielectric layer 104, in a SOI substrate, where a semiconductor substrate, such as a silicon substrate, is disposed below the dielectric layer 104. In the particular orientation illustrated in FIGS. 10, 11 and 13, the semiconductor substrate, which can be, for example, substrate 802 illustrated in FIG. 8, would be disposed above the dielectric layer 104 at surfaces 1003, 1103 and 1303 after it is formed in step 202. As noted above, the structures 1020 and 1120 can include one or more ring resonators 1206 illustrated in FIGS. 12A and 12B, as well as photonic waveguides 1004 and active devices 1002 and 1101, respectively, formed at step 202 using VLSI methods. Further, the photodiode array 1304 and the active device 1302 can be formed using VLSI methods at step 202. In accordance with one example, each of the photodiodes 1306 generate a current when excited by light between 190 and 1100 nm. This current can be converted to a voltage and then to digital information by using an Analog to Digital Converter that can be designed and integrated into, for example, a silicon CMOS or bipolar technology of the VLSI structure 1320. As indicated above, the structures 1000, 1100 and 1300 can each be an individual chip or part of a wafer.

Figure 14:
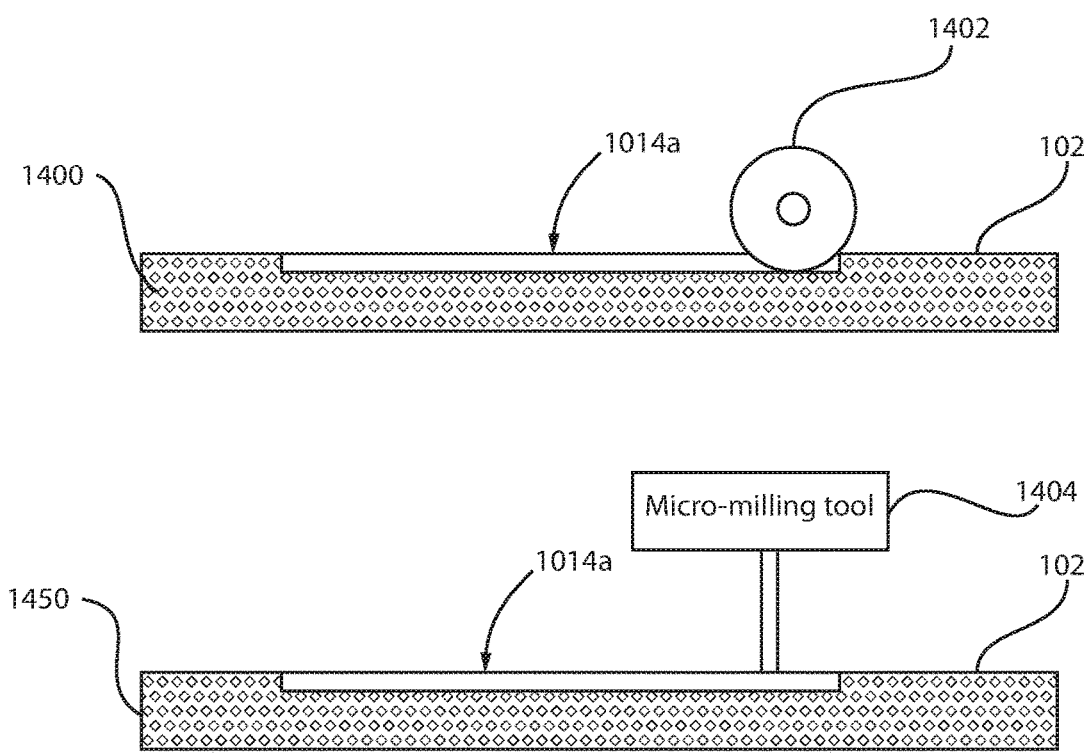
FIG. 14 is a diagram showing a micro-fluidic channel in glass using a dicing wheel and micro-milling, in accordance with embodiments of the present principles.
Figure 15:
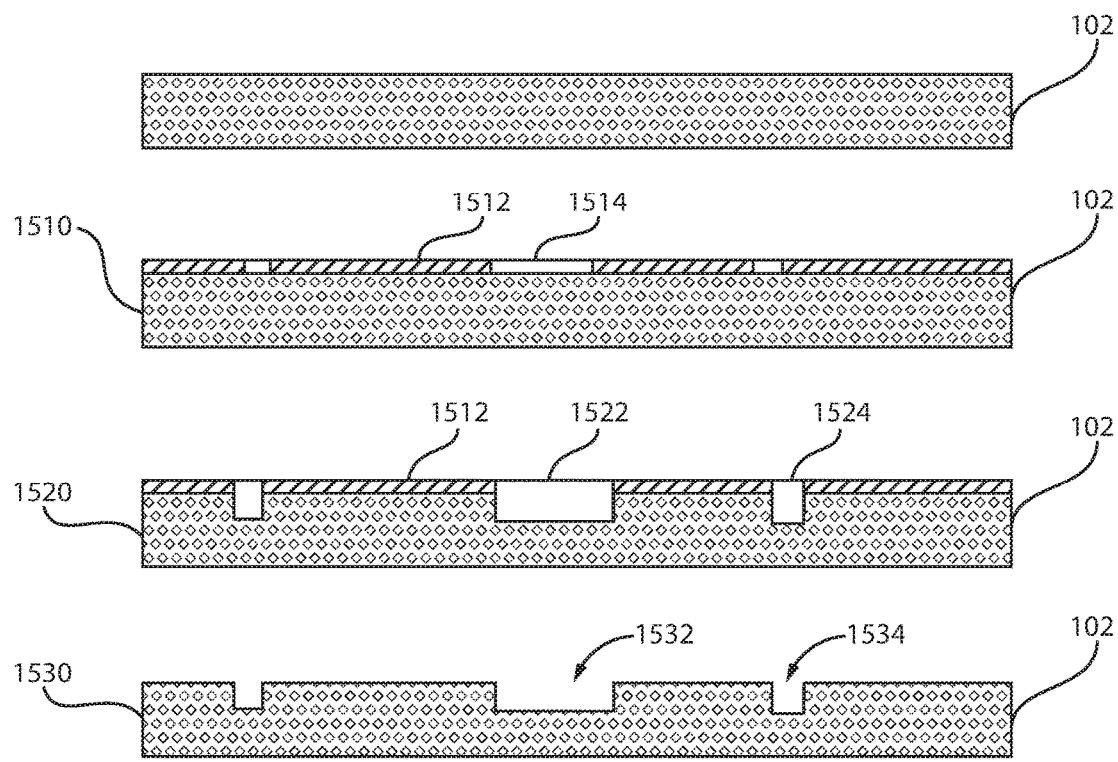
FIG. 15 is a diagram showing a micro-fluidic channel in glass using an etching process, in accordance with an embodiment of the present principles.
Figure 16:
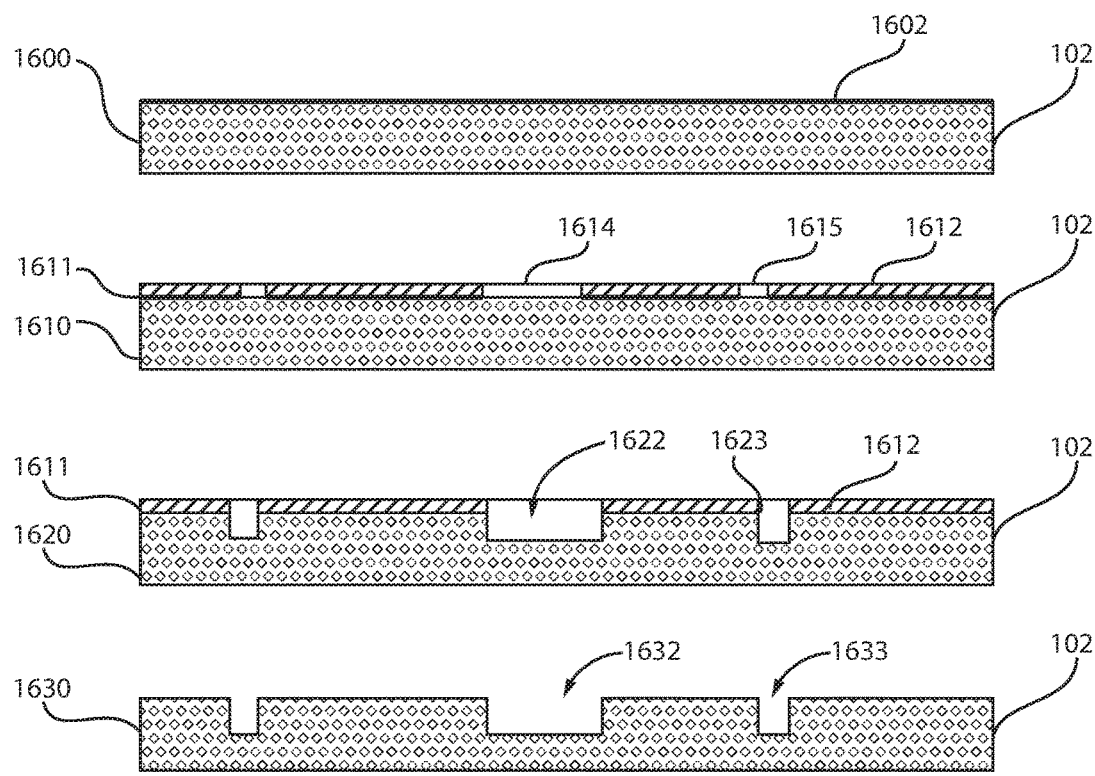
FIG. 16 is a diagram showing a micro-fluidic channel in glass using an etching process and a metal mask, in accordance with an embodiment of the present principles.

At step 204, an upper layer can be fabricated by forming one or more structures in the upper layer. For example, one or more microfluidic channels 1014 can be formed in the upper layer 1010 in structures 1000, 1100 and 1300. FIGS. 14-16 illustrate various methods for forming microfluidic channels 1014. For example, as illustrated by structure 1400, a dicing wheel 1402 can be applied to a relatively transparent substrate 102 with a relatively high resistance, described in detail herein above, to form the microfluidic channel 1014, a portion 1014a of which is depicted in FIG. 14. Alternatively, a micro-milling tool 1404 can be applied to the substrate 102 to form the microfluidic channel 1014, as illustrated in structure 1450 in FIG. 14. In the mechanical methods depicted in FIG. 14, a fine grit blade can be used as dicing wheel 1402, while a diamond tip rotary mill can be used as micro-milling tool 1404. In accordance with the methods of FIG. 14, microfluidic channels that have widths 50 μm to 500 μm can be formed.

Alternatively, step 204 can be performed in accordance with the method illustrated in FIG. 15, in which an etching process can be performed to form one or more microfluidic channels 1014. In particular, a photolithography process can be employed to define the channels, followed by chemical etching of the channels. As depicted in FIG. 15, a relatively transparent substrate 102 with a relatively high resistivity, described above, can be provided initially. A photoresist layer 1512 can be patterned in accordance with photolithography methods to form windows 1514 in the pattern that define the locations of the microfluidic channels, as illustrated in structure 1510. In addition, an HF (hydrofluoric acid) or some other fluoride-based chemical (ammonium fluoride, etc.) can be used to etch portions 1522 and 1524 of the microfluidic channels, as illustrated in structure 1520. The etch can be completed to form portions 1532 and 1534 of the microfluidic channels and the photoresist 1512 can be stripped to thereby complete the formation of microfluidic channels in an upper layer, as illustrated in structure 1530. The photolithography method depicted in FIG. 15 enables the formation of microfluidic channels with a smaller resolution and with improved control of the channel dimensions than the mechanical methods illustrated in FIG. 14. In accordance with the photolithography methods of FIG. 15, microfluidic channels that have widths 10 μm to 500 μm can be formed.

Alternatively, step 204 can be performed in accordance with the method illustrated in FIG. 16, in which an etching process can be performed with a metal mask to fabricate one or more microfluidic channels 1014. Here, a sacrificial metal layer 1602 is deposited, for example, by sputtering the metal material, on the relatively transparent substrate 102 having a relatively high resistance, as illustrated in structure 1600. The metal can be any low stress metal or a reasonable thickness to be able to support itself in the event of undercut. An example would be copper or nickel, in a thickness of 5-20 microns depending on stress and amount of etch. Further, the metal layer 1602 can be coated with a resist and patterned, which in turn would result in a patterned resist 1612 including windows 1614 and 1615 defining the microfluidic channel and a patterned thin metal layer 1611, as illustrated in structure 1610. In addition, the substrate 102 can be etched, as illustrated in structure 1620, using the patterned metal layer 1611 as a mask to form portions 1622 and 1623 of the microfluidic channels 1014. The etch can be completed to form portions 1632 and 1633 of the microfluidic channels and the photoresist 1612 and/or the metal layer 1611 can be stripped to thereby complete the formation of microfluidic channels 1014 in an upper layer, as illustrated in structure 1630. An HF (hydrofluoric acid) or some other fluoride based chemical (ammonium fluoride, etc.) can be used to etch the microfluidic channels 1014. Microfluidic channels that have widths 10 μm to 500 μm can be formed using this method. Alternatively, as opposed to chemically etching the substrate 102 to form portions 1622, 1623, 1632 and 1633 of the microfluidic channels 1014, a fine abrasive jet can be employed to form these portions of the microfluidic channels using the metallic layer 1611 as a mask for the abrasive jet stream.

At step 206, the VLSI structures formed at step 202 can be mounted to a support structure in the same manner discussed above with regard to step 206. For example, as illustrated in structure 300 in FIG. 3, the VLSI structures, which can include VLSI device layers 1020, 1120 and 1320, can be denoted by element 306 in FIG. 3 and can be processed, as discussed above.

In addition, at step 208, at least a portion of the semiconductor layer of the VLSI structures formed at step 202 can be removed as discussed above. The semiconductor layers disposed on side 1003, 1103 and 1303 of the dielectric layer 104 when the VLSI device layers 1020, 1120 and 1320 are formed at step 202 can be etched. As noted above, the semiconductor layer can be a silicon substrate of an SOI structure. In FIG. 3, the semiconductor layers can be denoted by element 302 and can be etched in the same manner discussed above with respect to FIG. 3. However, at step 208, for structures 1000 and 1100 in FIGS. 10 and 11, respectively, after the etching is completed, the binding layer 1016 can be deposited on the dielectric layer 104 in the position illustrated in FIGS. 10 and 11. Any known technique of forming binding layer material on the dielectric layer can be used. The most commonly used capture agents for biomolecular analysis include antibodies, antibody fragments, complementary DNA (cDNA), and aptamers. While antibody production relies on immune challenge and hybridoma formation, nucleic acid capture agents can be obtained from solid-phase DNA synthesis or multiple rounds of selective enrichment (SELEX) to identify or evolve the most effective capture agent. Alternatively, for the structure 1300 in FIG. 13, at step 208, after the etching is completed, the thin film optical filter 1316 can be deposited on the dielectric layer 104 in the position illustrated in FIG. 13. A well know technique for forming a thin film layer material on a dielectric layer is, for example, to use a dichroic filter which uses alternating layers of optical coatings with different refractive indexes that are built up upon a glass substrate. The interfaces between the layers of different refractive index produce phased reflections, selectively reinforcing certain wavelengths of light and interfering with other wavelengths. The layers are usually added by vacuum deposition. By controlling the thickness and the number of layers, the frequency (wavelength) of the passband of the filter can be tuned and made as wide or narrow as desired. Since unwanted wavelengths are reflected rather than absorbed, dichroic filters do not absorb this unwanted energy during operation and, thus, do not become nearly as hot as the equivalent conventional filter (which attempts to absorb all energy except for that in the passband) (see Fabry-Pérot interferometer for a mathematical description of the effect.). These layers can be patterned as well. Common coating materials are oxides such as $SiO_2$, $TiO_2$, $Al_2O_3$ and $Ta_2O_5$, and fluorides such as $MgF_2$, $LaF_3$ and $AlF_3$. Layers of high and low refractive index are grown alternatively with a typical thickness of $\lambda/4$. The number of layers can be 10 to 100, and it can be done by using Electron beam deposition, Ion-assisted deposition, Ion beam sputtering, etc. If only one fluorescent wavelength is to be detected, the filter 1316 can be uniform above one photodiode 1306 or above an array 1304 of photodiodes. The filter 1316 can also be patterned to fabricate an array of different optical filters 1316, with different transmission bands, aligned with corresponding photodiodes 1306 of the photodiode array 1304. In other words, the array or plurality of filters 1316 can be configured to filter different wavelength ranges of light such that different photodiodes 1306 of the array 1304 receive light of different wavelengths.

Figure 17:
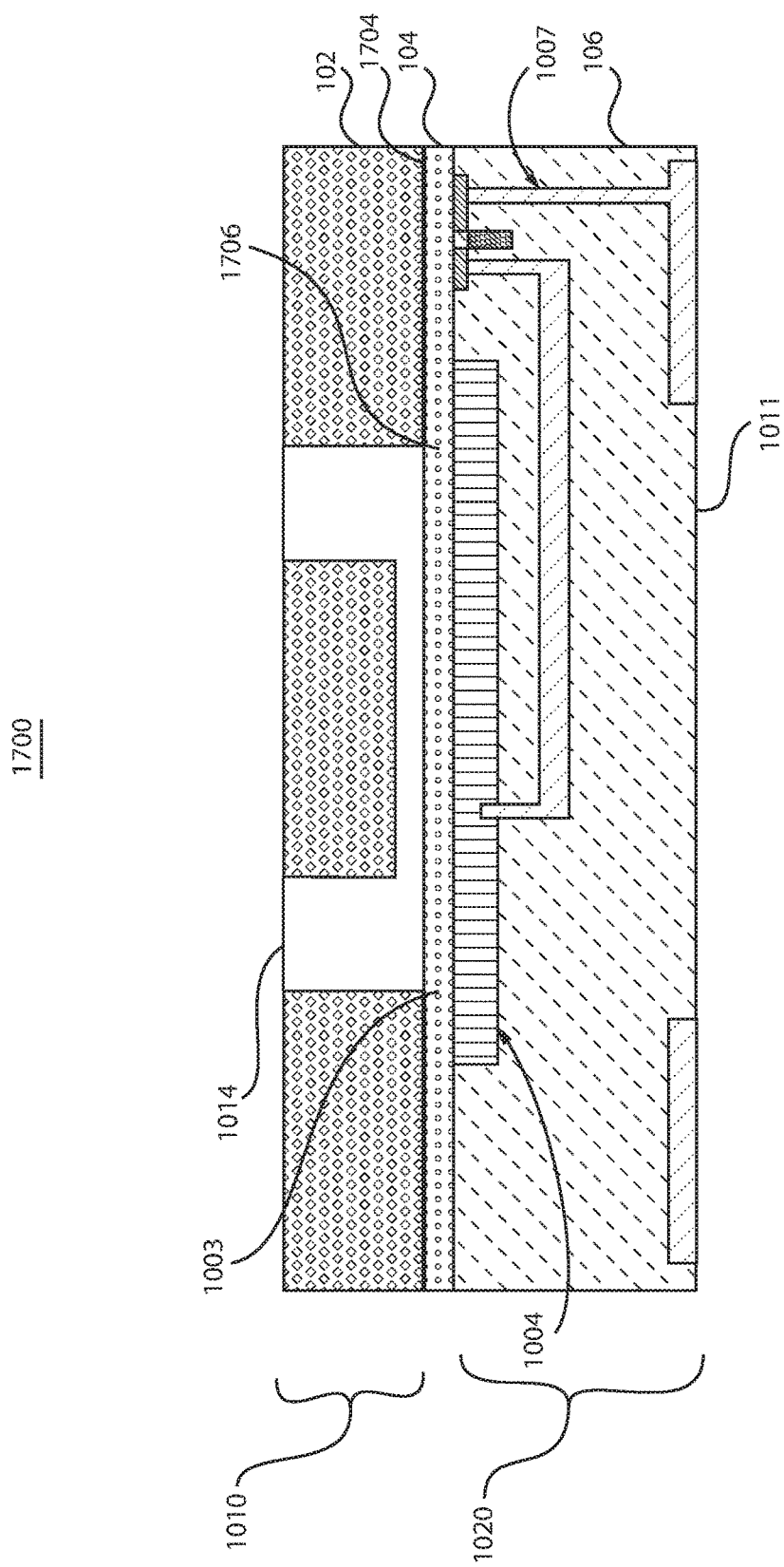
FIG. 17 is a cross-sectional view of an upper layer bonded to a VLSI structure using adhesive bonding, in accordance with an embodiment of the present principles.
Figure 18:
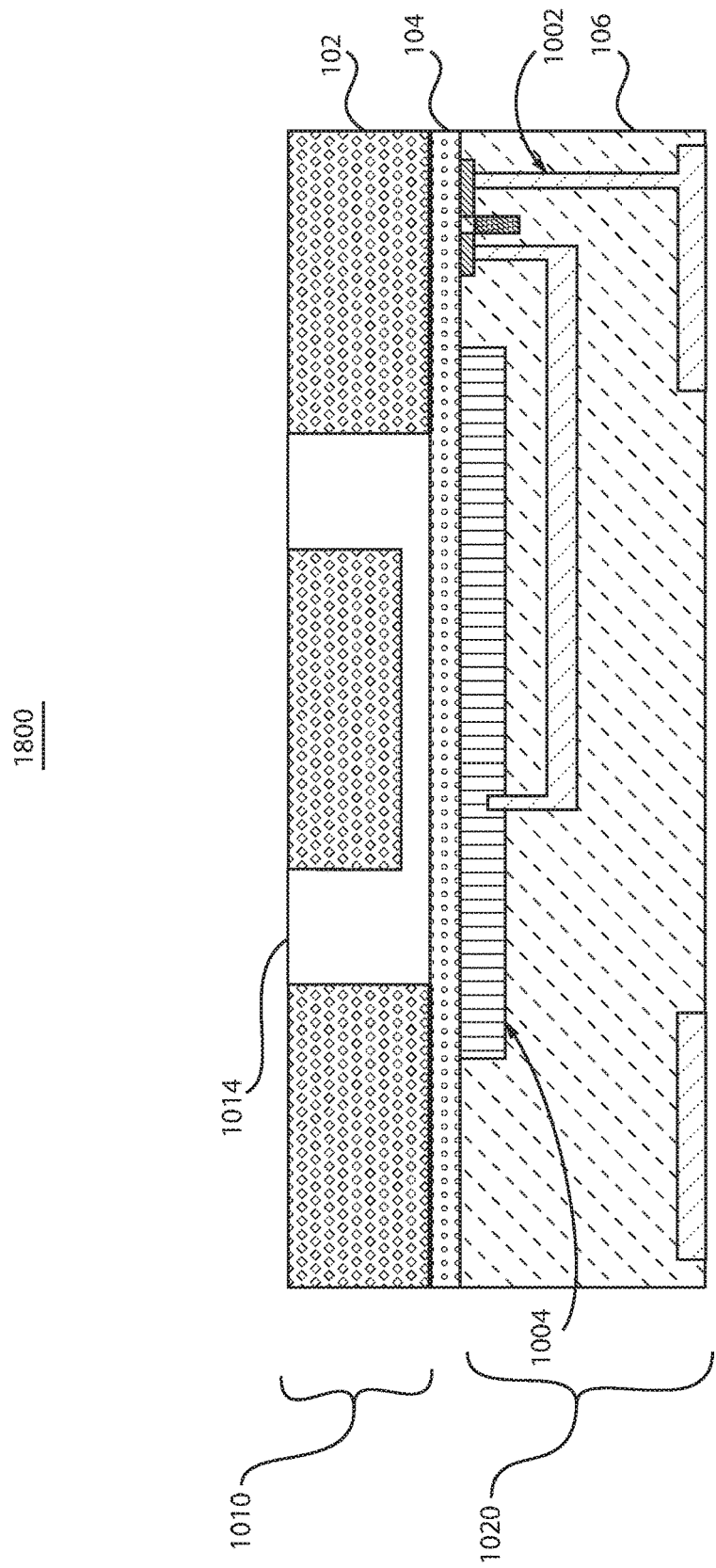
FIG. 18 is a cross-sectional view of an upper layer bonded to a VLSI structure using direct bonding, in accordance with an embodiment of the present principles.

At step 210, the upper layer formed at step 204 can be attached to the VLSI structure formed at step 208 in the same manner discussed above with respect to step 210. For example, the upper layer structure 1010 can be attached to the VLSI structures 1020, 1120 or 1320, as discussed above, for example with respect to structures 320 and 330, where element 322 can denote the upper layer structure 1010 and element 306 can denote VLSI structures 1020, 1120 or 1320. In particular, the upper layer 1010 can be bonded to the structures 1020, 1120 or 1320 as discussed above with respect to FIGS. 4 and 5. FIGS. 17 and 18 illustrate how the upper layer 1010 can be bonded to the VLSI structure 1020 in accordance with these methods, which, similarly, can be applied to the structures 1120 and 1320. As illustrated in structure 1700 of FIG. 17, the adhesive 1704, which can be the same material as adhesive 404, can be patterned under the microfluidic channel 1014 such that one or more windows 1706 are formed beneath the microfluidic channel 1014 to ensure that the adhesive does not interact with the channel 1014. Here, in either structure 1000 or structure 1100, the binding layer 1016 can be formed within the window 1706. Similarly, the wavelength filter 1316 can be formed within the window 1706 in the structure 1300. In each of these cases, the adhesive 1704 can be patterned before assembly, or it can be sublimated by beaming a laser, and residue can be flushed through the microfluidic channel 1014. This ensures that any interaction between the gas or liquid that is transmitted through the channel 1014 and the adhesive 1704 is avoided. Alternatively, as illustrated in structure 1800 of FIG. 18, attachment between the upper layer 1010 and the VLSI structure 1020 performed at step 210 can be implemented through direct bonding. For example, if the material 102 in the upper layer 1010 is a glass or quartz substrate, then the upper layer 1010 can be bound on perfectly flat surfaces, as discussed above with respect to FIG. 5. The upper layer 1010 and the VLSI structures 1100 and 1300 can also be attached at step 210 through direct bonding. In each of these cases, the alignment mechanism discussed above with respect to the method 200 can be employed to attach the upper layer 1010 to the VLSI structures 1020, 1120 and 1320.

At step 212, the VLSI optical sensor structures can be completed. For example, the laser source 120 can be attached to the upper layer 1010 perpendicularly above the microfluidic channel 1014, as illustrated in structure 1300 of FIG. 13. Alternatively, the laser source 120 can be attached to the upper layer 1010 as shown in FIG. 10 or can be attached to a circuit board or wafer 1102, as shown in FIG. 11. In addition, at step 220, the bottoms 1011, 1111, and 1311 of structures 1000, 1100 and 1300 can be attached to a circuit board or wafer using connectors 112, which can be C4 connectors and can transmit power as well as electrical signals. As indicated above, connectors 112 can be employed to attach the structure 1000, structure 1100, or the structure 1300, each of which can be an individual chip or part of a larger wafer, to a wafer including an integrated circuit. As noted above, FIG. 9 illustrates a top view of an implementation in which the VLSI structure is part of a wafer. For example, a VLSI structure 908, which can be structure 1000, structure 1100 or structure 1300, can be part of a wafer 902 and attached to a wafer 904, which can be, for example, wafer 1102, through connectors 112. Here, the wafer 902 can include hundreds, or more, VLSI structures 908. A typical wafer dimension is between 200 mm and 300 mm in the width and/or length of the wafer 902 in the top view shown in FIG. 9.

The embodiments described herein above integrate photonic and RF/mmwave/THz devices electronic devices and form optical sensors using simple and cost-effective VLSI technology, while at the same time avoiding optical and/or RF signal losses in the substrate. Furthermore, because the substrate back-side of a VLSI structure, such as side 103 of VLSI device layer 150 or side 1003 of VLSI device layer 1020, is used to integrate the devices with a device layer, such as upper device layer 101 or upper layer 1010, very little area of the VLSI structure is lost. For example, as illustrated by the exemplary embodiments described above, the integration need only utilize minor sections of the VLSI structure 150 for vias 123 coupled to the upper device layer 101.

FIG. 19 is a cross-sectional view of a VLSI structure 1950 having a pre-fabricated transparent device layer 1901 aligned there with using alignment marks 1977, in accordance with an embodiment of the present principles. FIG. 20 is an inverted partial cross-sectional view of the VLSI structure 1950 having a pre-fabricated transparent device layer 1901 aligned there with using alignment marks 1977 shown in FIG. 19, in accordance with an embodiment of the present principles. FIG. 21 is a cross-sectional view of the pre-fabricated transparent device layer 1901 shown in FIG. 19, in accordance with an embodiment of the present principles. The VLSI structure 1950 can be a VLSI chip or wafer of a VLSI chip that is aligned to the pre-fabricated transparent device layer 1901. The top of the dielectric layer 1904 constitutes the top of the VLSI structure 1950, and includes alignment marks 1977 on a side 1905 thereof. The transparent substrate 1966 and the VLSI structure 1950 are aligned such that in this example, the transparent alignment mark 1978 is visible in between the VLSI alignment marks 1977. Since the VLSI back-end of the line 1904, the substrate 1952, the thin BOX 1953, and the adhesive 1944 are transparent, the alignment can be done by looking either through the transparent substrate 1966 or the glass handler substrate 1951, i.e., the transparent substrate 1966 is aligned on the VLSI structure 1950 or the VLSI structure 1950 is aligned on the transparent substrate 1966. Referring to FIG. 20, the alignment marks 1977 can be made using Si diffusion. Metal can also be used.

Having described preferred embodiments of methods, systems and devices that integrate photonic and electronic devices with SOI VLSI microprocessor technology (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating an integrated structure comprising:
    forming a very large scale integration (VLSI) structure including a semiconductor layer at a top of the VLSI structure;
    mounting the VLSI structure to a support structure;
    removing at least a portion of the semiconductor layer from the VLSI structure;
    attaching an upper layer to the top of the VLSI structure, wherein said upper layer is primarily composed of a material that has at least one of a higher resistivity or a higher transparency than said semiconductor layer and said upper layer includes a mounting location for at least one of a photonic device or an electronic device; and
    releasing said VLSI structure from the support structure.

2. The method of claim 1, wherein said VLSI structure includes at least one electronic element and at least one photonic element.

3. The method of claim 2, wherein said VLSI structure includes a dielectric layer that has a thickness of less than 200 nm and is disposed beneath said semiconductor layer.

4. The method of claim 3, wherein, at said attaching step, one or more of said at least one electronic element or said at least one photonic element is disposed beneath said dielectric layer.

5. The method of claim 1, further comprising fabricating said upper layer by providing said mounting location as at least one via filled with a conductive material.

6. The method of claim 1, further comprising forming at least a portion of the electronic device in the upper layer before the upper layer is attached to the top of the VLSI structure.

7. The method of claim 1, further comprising forming at least a portion of the photonic device and at least a portion of the electronic device in the upper layer.

8. The method of claim 7, wherein the portion of the electronic device is coupled to an active electronic device.

9. The method of claim 8, wherein the portion of the electronic device is an antenna.

10. The method of claim 1, further comprising attaching at least one of an optical fiber or a laser to said mounting location.

11. The method of claim 1, wherein the material has a transmittance of greater than eighty percent at a particular light wavelength used and a resistivity of at least 10 Ohm-.com.

12. The method of claim 1, further comprising attaching a bottom of said VLSI structure to a wafer.

13. A method for fabricating an integrated structure comprising:
    forming a very large scale integration (VLSI) structure including a semiconductor layer at a top of the VLSI structure;
    removing at least a portion of the semiconductor layer from the VLSI structure; and
    attaching an upper layer to the top of the VLSI structure, wherein said upper layer is primarily composed of a material that has at least one of a higher resistivity or a higher transparency than said semiconductor layer and said upper layer includes a mounting location for at least one of a photonic device or an electronic device.

14. The method of claim 13, wherein said VLSI structure includes at least one electronic element and at least one photonic element.

15. The method of claim 14, wherein said VLSI structure includes a dielectric layer that has a thickness of less than 200 nm and is disposed beneath said semiconductor layer.

16. The method of claim 15, wherein, at said attaching step, one or more of said at least one electronic element or said at least one photonic element is disposed beneath said dielectric layer.

17. The method of claim 13, further comprising fabricating said upper layer by providing said mounting location as at least one via filled with a conductive material.

18. The method of claim 13, further comprising forming at least a portion of the electronic device in the upper layer before the upper layer is attached to the top of the VLSI structure.

19. The method of claim 13, further comprising forming at least a portion of the photonic device and at least a portion of the electronic device in the upper layer.

20. The method of claim 13, wherein the material has a transmittance of greater than eighty percent at a particular light wavelength used and a resistivity of at least 10 Ohm-.com.

* * * * *